United States Patent
Reykowski et al.

(10) Patent No.: US 10,932,216 B2
(45) Date of Patent: Feb. 23, 2021

(54) SYSTEMS AND METHODS FOR WIRELESS COMMUNICATION FOR MAGNETIC RESONANCE IMAGING (MRI) SYSTEMS

(71) Applicant: KONINKLIJKE PHILIPS N.V., Eindhoven (NL)

(72) Inventors: Arne Reykowski, Gainsville, FL (US); Paul Redder, Highland Heigts, OH (US); Timothy Ortiz, Gainsville, FL (US); George Randall Duensing, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 431 days.

(21) Appl. No.: 16/061,723

(22) PCT Filed: Dec. 12, 2016

(86) PCT No.: PCT/IB2016/057520
§ 371 (c)(1),
(2) Date: Jun. 13, 2018

(87) PCT Pub. No.: WO2017/103759
PCT Pub. Date: Jun. 22, 2017

(65) Prior Publication Data
US 2018/0376441 A1    Dec. 27, 2018

Related U.S. Application Data

(60) Provisional application No. 62/268,100, filed on Dec. 16, 2015.

(51) Int. Cl.
*H04W 56/00* (2009.01)
*G01R 33/36* (2006.01)
(Continued)

(52) U.S. Cl.
CPC .... *H04W 56/0085* (2013.01); *G01R 33/3692* (2013.01); *H04B 1/26* (2013.01); *H04B 1/30* (2013.01)

(58) Field of Classification Search
None
See application file for complete search history.

(56) References Cited

U.S. PATENT DOCUMENTS 6,314,128 B1    11/2001   Bunker et al.
6,658,048 B1    12/2003   Valio
(Continued)

FOREIGN PATENT DOCUMENTS

CN    103166682 A    6/2013
GB    581568 A       10/1946

OTHER PUBLICATIONS

Alsindi et al "Ultra Wideband Channel Measurement Characterisation for Wireless Magnetic Resonance Imaging Applications" Information Sciences and Systems, 2007, CISS '07.
(Continued)

*Primary Examiner* — Rodney E Fuller

(57) ABSTRACT

A magnetic resonance imaging (MRI) system (100, 400, 500) includes a wireless RF station (20, 320, 420, 520, 620) which is associated with one or more RF coils which sense the magnetic resonance (MR) signal emitted from a subject under MRI examination. The wireless RF station communicates digital data representing the sensed MR signal to an MRI controller (124) for further processing, which may include display. An internal clock (2202, 3202) in the wireless RF station is precisely synchronized with the MRI controller clock (108, 2101, 3101), with carrier phase synchronization and code phase tracking of a predefined code sequence such as a pseudo random number (PRN) sequence.

20 Claims, 13 Drawing Sheets

(51) Int. Cl.
*H04B 1/26* (2006.01)
*H04B 1/30* (2006.01)

(56) References Cited

U.S. PATENT DOCUMENTS

| | | | |
|---|---|---|---|
| 6,704,344 | B1 | 3/2004 | Hu et al. |
| 7,123,009 | B1 | 10/2006 | Scott |
| 8,093,900 | B2 | 1/2012 | Bennett |
| 8,155,101 | B2 | 4/2012 | Van Helvoort et al. |
| 8,258,788 | B2 | 9/2012 | Hulbert et al. |
| 2003/0078004 | A1 | 4/2003 | Vester |
| 2005/0107681 | A1 | 5/2005 | Griffiths |
| 2008/0014894 | A1* | 1/2008 | Manku .................. H04B 15/06 455/318 |
| 2010/0259261 | A1* | 10/2010 | Saes .................. G01R 33/341 324/309 |
| 2011/0109316 | A1 | 5/2011 | Akita et al. |
| 2011/0227571 | A1 | 9/2011 | Sekiguchi et al. |
| 2011/0227574 | A1 | 9/2011 | Akita et al. |
| 2013/0127465 | A1 | 5/2013 | Kwon et al. |
| 2015/0066413 | A1 | 3/2015 | Bhagat et al. |
| 2015/0351067 | A1 | 12/2015 | Taylor et al. |
| 2020/0057129 | A1* | 2/2020 | Ji ........................ G01R 33/567 |

OTHER PUBLICATIONS

Wiehl et al "Channel Impuse Response Inside a Magnetic Resonance Imaing Device . . . " Mikon 2012, 19th International Conf. on Microwaves, Radar and Wireless Communications, May 21-23, Warsaw Poland.

Einstein, A. (1905), "Zur Elektrodynamik bewegter Körper", Annalen der Physik 17 (10): 891-921.

Poincaré, Henri (1898/1913), "The Measure of Time", The foundations of science, New York: Science Press, pp. 222-234.

Dardari, Davide, "Ranging With Ultrawide Bandwidth Signals in Multipath Environments", Proceedings of the IEEE I vol. 97, No. 2, Feb. 2009.

Carbonelli, C, "Synchronization Algorithms for UWB Signals", IEEE Comm, vol. 54, No. 2, Feb. 2006.

Denis, Benoit, "Joint Distributed Synchronization and Positioning in UWB Ad Hoc Networks Using TOA", IEEE Transactions on Microwave Theory and Techniques, vol. 54, No. 4, Apr. 2006.

Mahfouz, MR, "Investigation of High-Accuracy Indoor 3-D Positioning Using UWB Technology", IEEE Transactions on Microwave Theory and Techniques, vol. 56, No. 6, Jun. 2008.

Gezici, Sinan, "Localization via Ultra-Wideband Radios", IEEE Signal Processing Magazine [70] Jul. 2005.

Braasch et al "GPS Receiver Architectures and Measurments" Proceedings of the IEEE, vol. 87, No. 1 Jan. 1999.

Langley,R. "Why Is the GPS Signal So Complex" GPS World May/Jun. 1990.

Mahffouz et al "Towards Sub-Millimeter Accuracy in UWB Positioning for Indoor Medical Environments" Bio Wireless 2011P. 83-86.

Sadeghi, Maryam, et al "Time Synchronizing Signal by GPS Satellites", WSEAS Transactions on Communications, Issue 5, vol. 7, May 2008.

\* cited by examiner

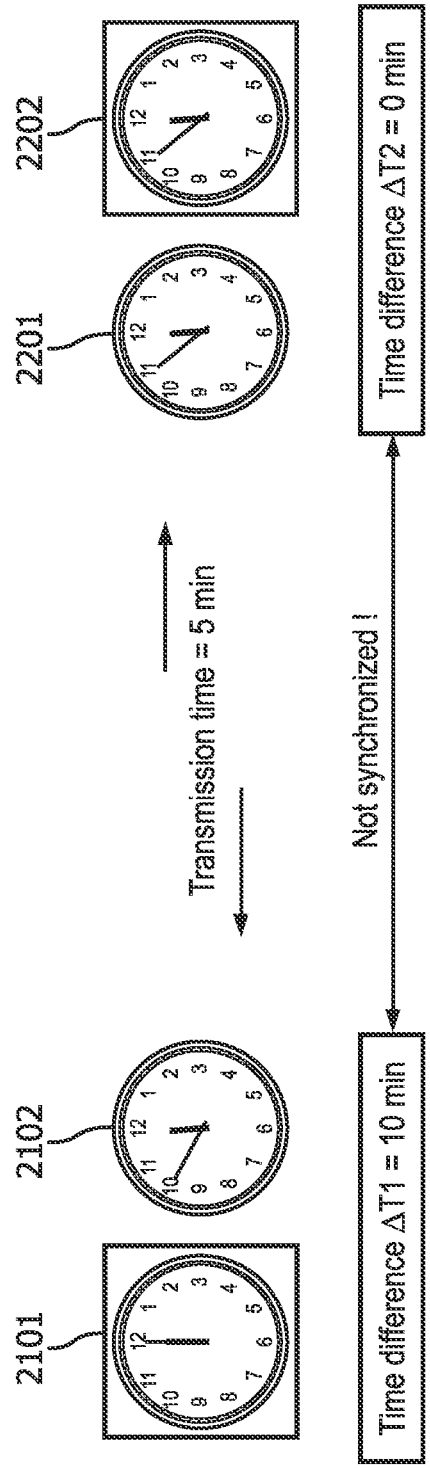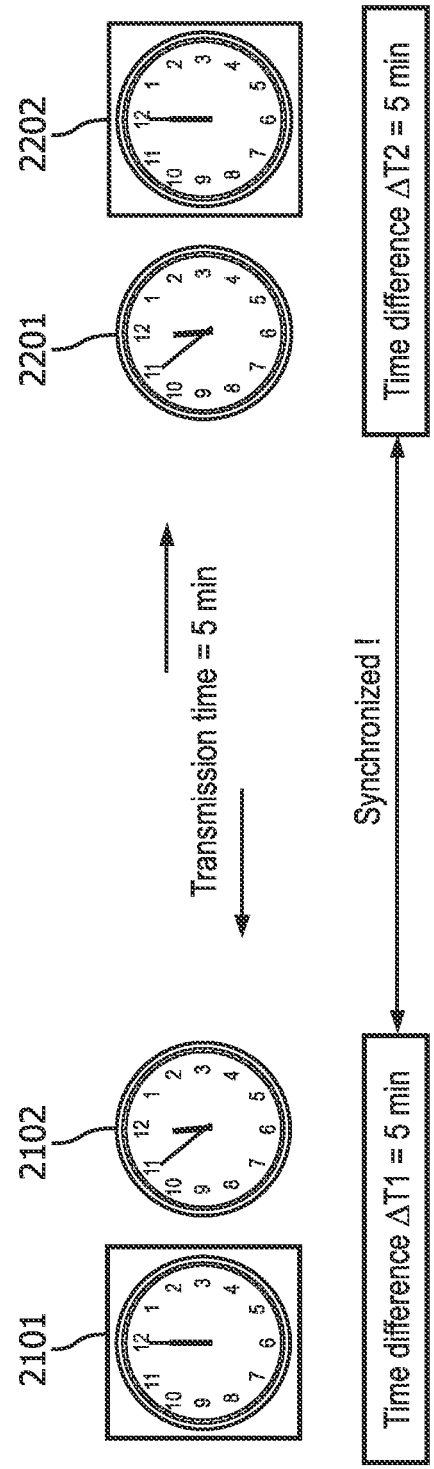

SYSTEMS AND METHODS FOR WIRELESS COMMUNICATION FOR MAGNETIC RESONANCE IMAGING (MRI) SYSTEMS

CROSS REFERENCE TO RELATED APPLICATIONS

This application is a U.S. national phase application of International Application No. PCT/IB2016/057520, filed on Dec. 12, 2016, which claims the benefit of U.S. provisional Application Ser. No. 62/268,100 filed on Dec. 16, 2015 and is incorporated herein by reference.

TECHNICAL FIELD

The present system generally relates to a magnetic resonance imaging (MRI) system with a wireless-type radiofrequency (RF) coil portion and a method of operation thereof.

BACKGROUND AND SUMMARY

Magnetic Resonance Imaging (MRI) is an imaging method that generally uses frequency and phase encoding of protons for image reconstruction. Recently, MRI systems have begun to use a wireless-type RF coil or coils to sense magnetic resonance signal emitted from a subject under MRI examination. In particular, the wireless RF coils acquire analog MR information during an acquisition period, and then an associated RF coil unit (also referred to herein as a wireless RF station) converts the analog MR information to form digitized information, such as digitized raw data (k-space) information. Thereafter, the wireless RF station communicates the digitized information to a system controller for further processing and/or display on a display of the MRI system.

Here, the wireless RF station relies upon an internal clock for correct synchronization with a system clock (e.g., a master clock) of the MRI system. However, because of the wireless nature of wireless RF coils and induced RF jitter and phase drift, it is often difficult to accurately synchronize the wireless RF station internal clock with the MRI system clock using conventional wireless communication methods. For example, there may be a varying time delay in a Line-Of-Sight (LOS) path, a LOS path with blockage, and/or a non-LOS path between the RF station and the communication station of the rest of the MRI system which is tied to the master clock, which may be caused by motion between transmitter and receiver and/or changes in the channel model. This time-varying time delay can cause drift between the internal clock of the RF station and the master clock.

Unfortunately, when the wireless RF station internal clock is not accurately synchronized with the MRI system clock, phase noise of the wireless RF station internal clock can cause image artifacts in reconstructed images due to the nature of an encoding method being used, particularly during long acquisitions. For example, it can be shown that if it is required that the clock-induced root-mean-square (RMS) phase error in raw image data remain below 1 degree, then the RMS time jitter should be controlled to remain less than 44 picoseconds (ps) at 64 Mhz and less than 22 ps at 128 MHz.

Accordingly, it would be desired to provide a system and method of wireless communication for an MRI system. It would further be desired to provide a system and method of wireless communication for an MRI system which facilitates clock recovery and synchronization of an internal clock of a wireless RF station to the master clock of the MRI system which can compensate for varying time delay in a communication path between the RF station and the communication station of the rest of the MRI system. Furthermore, it would be desirable to provide a system and method for a wireless RF station to synchronize the wireless RF station internal clock to an MRI system clock based on an MRI system transmission received via multipath propagation.

In one aspect, the present invention can provide a method including: transmitting from a radio frequency (RF) transmitter of a first wireless communication station of an magnetic resonance imaging (MRI) system a first transmit signal comprising a first baseband signal upconverted with a first carrier signal, the first carrier signal having a first carrier frequency which is a product of a first value and a first local oscillator (LO) frequency of a first LO of the first wireless communication station, the first carrier signal being synchronous with the first LO of the first wireless communication station; receiving via a wireless channel at an RF receiver of a second wireless communication station of the MRI system a phase shifted first transmit signal comprising the first transmit signal with its phase shifted by a first channel phase shift which is equal to a time delay of the wireless channel multiplied by the first carrier frequency; at the second wireless communication station, multiplying a second baseband signal with a correction signal to produce a corrected second baseband signal, and transmitting a second transmit signal comprising the corrected second baseband signal upconverted with a second carrier signal, the second carrier signal having a second carrier frequency which is a product of a second value and a second LO frequency of a second LO of the second wireless communication station, wherein the second transmit signal has a second transmit carrier frequency which is a product of the second value and the first LO frequency and which is synchronous in frequency with the first LO of the first wireless communication station; receiving via the wireless channel at an RF receiver of the first wireless communication station a phase shifted second transmit signal comprising the second transmit signal with its phase shifted by a second channel phase shift which is equal to the time delay of the wireless channel multiplied by the second transmit carrier frequency; and ascertaining at the first wireless communication station the time delay of the wireless channel from the received phase shifted second transmit signal.

In general, the second LO frequency will have a frequency offset with respect to the first LO frequency. Beneficially, the second wireless communication station adjusts for this frequency offset when transmitting the second transmit signal back to the first wireless communication station. However a phase shift or error due to the wireless channel remains. The first wireless communication station can detect the total phase error, determine a phase correction term, and encode that phase correction term in a message that it sends back to the second wireless communication station. The second wireless communications station can then use this phase correction term to generate a third signal that is synchronous with the first LO of the first wireless station. In some embodiments, the third signal has a frequency which is a product of the second value ($N_1$) and the first LO frequency. In some embodiments, the third signal may be passed through a $N_1$ divider/prescaler to arrive at the original first LO frequency Another aspect of the present invention can provide a system comprising a first wireless communication station and a second wireless communication station. The first wireless communication station includes: a first local oscillator (LO) configured to produce a first LO signal having a first LO frequency, a first radio frequency (RF) transmitter, and a first RF receiver, wherein the first RF transmitter is configured to transmit a first transmit signal comprising a first baseband signal upconverted with a first carrier signal, the first carrier signal having a first carrier frequency which is a product of the first value and the first LO frequency, the first carrier signal being synchronous with the first LO. The second wireless communication station includes: a second LO configured to produce a second LO signal having a second LO frequency, a second RF transmitter, and a second RF receiver, wherein the second RF receiver is configured to receive via a wireless channel a phase shifted first transmit signal comprising the first transmit signal with its phase shifted by a first channel phase shift which is equal to a time delay of the wireless channel multiplied by the first carrier frequency wherein the second wireless communication station is configured to multiply a second baseband signal with a correction signal to produce a corrected second baseband signal, wherein the second RF transmitter is configured to transmit a second transmit signal comprising the corrected second baseband signal upconverted with a second carrier signal, the second carrier signal having a second carrier frequency which is a product of the second value and a second frequency of a second LO of the second wireless communication station, wherein the second transmit signal has a second transmit carrier frequency which is a product of the second value and the first LO frequency and which is synchronous in frequency with the first LO of the first wireless communication station, but has a variable phase due to a first channel phase shift which is equal to a time delay of the wireless channel multiplied by the second carrier frequency, wherein the first RF receiver is configured to receive via the wireless channel a phase shifted second transmit signal comprising the second transmit signal with its phase shifted by a second channel phase shift which is equal to the time delay of the wireless channel multiplied by the second transmit carrier frequency, and wherein the first wireless communication station ascertains the time delay of the wireless channel from the received phase shifted second transmit signal.

Yet another aspect of the present invention can provide a system comprising a first wireless communication station and a second wireless communication station. The first wireless communication station may include a first local clock; a first pseudorandom number (PRN) sequence generator configured to generate a first PRN sequence using the first local clock; and a first transmitter configured to transmit a first transmit signal including the first PRN sequence. The second wireless communication station is configured to receive via a wireless channel a phase shifted first transmit signal comprising the first transmit signal with its phase shifted by a first channel phase shift which depends upon a time delay of the wireless channel. The second wireless communication station includes: a second local clock; a second PRN sequence generator configured to generate the first PRN sequence using the second local clock; a recovered first clock recovered from the received phase shifted first transmit signal; and a processor configured to: recover the first PRN sequence from the received phase shifted first transmit signal using the recovered first clock; and compare the second PRN sequence to the recovered first PRN sequence to determine a code phase shift error between the first wireless communication station and the second wireless communication station.

BRIEF DESCRIPTION OF THE DRAWINGS

The present invention will be more readily understood from the detailed description of exemplary embodiments presented below considered in conjunction with the accompanying drawings.

FIG. 2A illustrates an example of local clocks at two communication stations which are not synchronized.

FIG. 2B illustrates an example of local clocks at two communication stations which are synchronized.

DETAILED DESCRIPTION

The present invention will now be described more fully hereinafter with reference to the accompanying drawings, in which embodiments of the present invention are shown. The present invention may, however, be embodied in different forms and should not be construed as limited to the embodiments set forth herein. Rather, these embodiments are provided as teaching examples of the invention.

Figure 1:
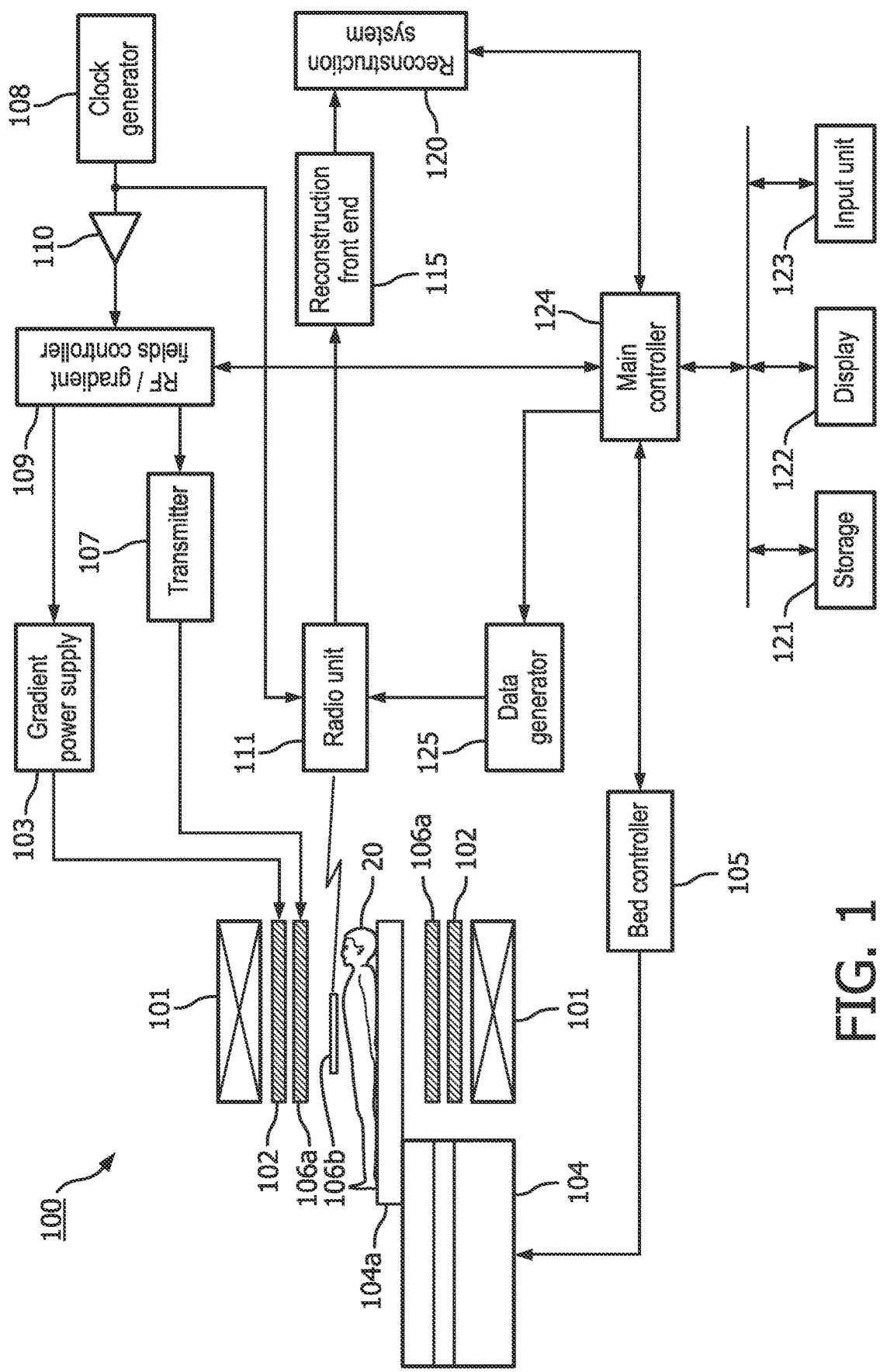
FIG. 1 illustrates an exemplary embodiment of a magnetic resonance imaging (MRI) system 100.

FIG. 1 illustrates an exemplary embodiment of a magnetic resonance imaging (MRI) system 100.

MRI system 100 includes a static magnet 1, a gradient coil 2, a gradient power supply 103, a patient table or bed 104, a patient table controller 105, RF coil unit 106a, wireless RF station 106b, a transmitter 107, a clock generator 108, an RF/gradient fields controller 109, a driver 110, a radio unit 111, a reconstruction front end 115, a reconstruction system 120, a storage 121, a display 122, an input unit 123, a main controller 124 and a data generator 125.

In some embodiments, the components other than wireless RF station 106b are included in a main unit separate from wireless RF station 106b. Moreover, the main unit may be divided into a gantry and a processing system. In this case, for example, static magnet 101, gradient coil 102, gradient power supply 103, patient table 104, patient table controller 105, RF coil unit 106a, transmitter 107, RF/gradient fields controller 109 and radio unit 111 may be provided in the gantry, while clock generator 108, driver 110, reconstruction front end 115, reconstruction system 120, storage 121, display 122, input unit 123 and main controller 124 may be provided in the processing system.

Static magnet 101 has a hollow cylindrical shape, and generates a uniform static magnetic field in its internal space. For example, a permanent magnet or superconducting magnet is used as static magnet 101.

Gradient coil 102 has a hollow cylindrical shape, and is disposed inside static magnet 101. Gradient coil 102 may include a combination of three kinds of coils corresponding to X, Y, Z axes which are orthogonal to one another. Gradient coil 102 generates a gradient magnetic field having its intensity inclined along the X, Y, Z axes when the three kinds of coils are separately supplied with currents from gradient power supply 103. In addition, the Z axis is in the same direction as, for example, the direction of the static magnetic field. The gradient magnetic fields of the X, Y, and Z axes correspond to, for example, a slice selecting gradient magnetic field Gs, a phase encoding gradient magnetic field Ge and a read-out gradient magnetic field Gr, respectively. The slice selecting gradient magnetic field Gs is used to determine a given imaging section. The phase encoding gradient magnetic field Ge is used to change the phase of a magnetic resonance signal in accordance with a spatial position. The read-out gradient magnetic field Gr is used to change the frequency of the magnetic resonance signal in accordance with the spatial position.

A subject 20 is inserted into an internal space (imaging space) of gradient coil 102 while being mounted on a top board 104a of patient table 104. Patient table 104 moves top board 104a in its longitudinal direction (right-and-left direction in FIG. 1) and vertical direction under the control of patient table controller 105. Normally, patient table 104 is installed so that this longitudinal direction is parallel with the central axis of static field magnet 101.

RF coil unit 106a includes one or more coils contained in a cylindrical case. RF coil unit 106a is disposed inside gradient magnetic field coil 102. RF coil unit 106a is supplied with a high-frequency pulse (RF pulse) from transmitter 107 to generate a high-frequency magnetic field.

RF station 106b may be mounted on top board 104a, embedded in top board 104a, or attached to subject 20. At the time of imaging, wireless RF station 106b is inserted into the imaging space together with subject 20, and receives or senses the magnetic resonance signal emitted from subject 20 as electromagnetic waves and in response thereto produces digital data representing the sensed magnetic resonance signal. Wireless RF station 106b may include or be attached to one, two or more receiving RF coil units which may include any kind of coils for sensing the magnetic resonance signal emitted from subject 20. Wireless RF station 106b includes a function of wirelessly transmitting as an electric signal, for example as a digital signal, the digital data representing the magnetic resonance signal received from subject 20.

Transmitter 107 supplies RF coil unit 106a with the RF pulse corresponding to a Larmor frequency.

Clock generator 108 generates a first clock signal having a predetermined frequency. This first clock signal may be used as a system clock serving as a reference for the timing of the overall operation of Mill system 100.

RF/gradient fields controller 109 changes the gradient magnetic fields in accordance with a required pulse sequence under the control of main controller 124, and controls gradient power supply 103 and transmitter 107 so that the RF pulse may be transmitted. In addition, RF/gradient fields controller 109 is provided with the first clock signal after the level of this signal has been properly adjusted by driver 110. RF/gradient fields controller 109 carries out the pulse sequence synchronously with this first clock signal.

Radio unit 111 receives the magnetic resonance signal digitally and wirelessly transmitted from wireless RF station 106b. Radio unit 111 digitally demodulates the received digital magnetic resonance signal, and then outputs the demodulated signal to reconstruction front end 115. Radio unit 111 modulates the first clock signal by a data signal output by data generator 125, and thereby wirelessly transmits the data signal together with the first clock signal as a first transmit signal to RF station 106b.

Reconstruction front end 115 subjects the magnetic resonance signal provided from radio unit 111 to gain control, frequency conversion and quadrature detection. Reconstruction front end 115 further decompresses the amplitude of the magnetic resonance signal compressed in wireless RF station 106b.

Reconstruction system 120 reconstructs an image of subject 20 on the basis of at least one of the magnetic resonance signals processed in reconstruction front end 115.

Storage 121 stores various kinds of data such as image data indicating the image reconstructed in reconstruction system 120.

Display 122 displays the image reconstructed in the reconstruction system 120 or various kinds of information including various kinds of operation screens for a user to operate MRI system 100, under the control of main controller 124. Any convenient display device, such as a liquid crystal display, can be used as display 22.

Input unit 123 accepts various commands and information inputs from an operator of MRI system 100. Input unit 123 may include a pointing device such as a mouse or a track ball, a selecting device such as a mode changeover switch, and/or an input device such as a keyboard.

Main controller 124 has a CPU, a memory, etc. that are not shown, and controls the whole MRI system 100.

Data generator 125 generates a data signal for communication with RF station 106b via radio unit 111, under the control of main controller 124.

The general operation of an MRI system or apparatus is well known and therefore will not be repeated here.

Wireless RF station 106b relies upon an internal clock for correct synchronization with clock generator of the MRI system. However, because of the wireless nature of wireless RF coils and induced RF noise, it is often difficult to accurately synchronize the receiver clock with the system clock using conventional wireless communication methods.

In the discussion to follow, reference is made to a first communication station, and in particular a first wireless communication station, and a second communication station, in particular a second wireless communication station. In some embodiments, the first wireless communication station may be considered to be a base station, and the second wireless communication station may be considered to be a remote, or mobile, station. In some embodiments, portions of the main unit of MRI system 100—including in particular RF coil unit 106a, transmitter 107, radio unit 111, clock generator 108, driver 110, and main controller 124—may correspond to a first wireless communication station described below, wireless RF station 106b may correspond to a second wireless communication station described below.

MRI systems are required to maintain an ecosystem that can coexist in a medical facility that is stable and well controlled to function properly and not interfere with other electromagnetic devices. This is due to the highly sensitive nature of the weak patient signal and strong MRI transmitter. These requirements create the need for MRI systems to be located within a restricted and confined RF shielded room. The MRI location and ecosystem necessitates specific and unusual conditions for wireless communication. A wireless communication protocol should maintain a high level service of quality within an environment with unpredictable MRI conditions that consist of high power spurious emissions, dense multipath channel condition with large variation of signal propagation over position, frequency and time without impacting the MRI signal or signal-to-noise ratio (SNR).

To address one or more of these issues, in some embodiments the first wireless communication station of the main unit of MRI system 100 may communicate with wireless RF station 106b according to a communication protocol which is compliant with a standard for ultra-wideband (UWB) communications in which a short pulse (e.g., less than a few nanoseconds) phase shift keying (PSK) modulated signal is spread over a wide spectrum. This short pulse UWB technology may also be referred to as direct sequence UWB (DS-UWB) or impulse radio UWB (IR-UWB). Unlike traditional narrowband technology (Bluetooth, WiFi, etc) or orthogonal frequency-division multiplexing UWB (OFDM-UWB) which are greatly affected by signal propagation conditions, pulse UWB thrives in multipath environments such as might be found in the MRI room. Here it is understood that UWB means a transmission with a bandwidth of greater than 500 MHz for a given power emission mask, which for short pulse PSK UWB means that the energy per bit (Eb) has a spread factor equal to the channel bandwidth greater than 500 MHz. Because the Eb is spread over the entire UWB channel, there is a zero mean fading. The short pulse also benefits from the timing of the reflected path delay being greater than the transmission period. The probability density function for short pulse UWB channels can be greater than free-space performance in a multipath environment. The spread factor and emission limits also mean that short pulse UWB has a low probability to interference and interception, which is required to coexist in an environment where strong MRI frequency and harmonic spurs are generated. The UWB standard allows for transmissions in a frequency range from 3.1 GHz to 10.6 GHz, which allows the exact frequencies which are employed to be selected to avoid heavily congested spectrum like the 2.4 GHz and 5.8 GHz.

One of the challenges for clock synchronization in wireless MRI system communication is temporal variations in the propagation delay for the wireless clock synchronization signal. Such temporal variations may be caused by motion of the patient, the patient table, or operating personal inside the MRI room.

FIGS. 2A and 2B show a simple example to highlight the challenges of clock synchronization using exchange of signals at the speed of light. In particular, FIG. 2A illustrates an example of local clocks 2101 and 2202 at two communication stations which are not synchronized, and FIG. 2B illustrates an example of the local clocks 2101 and 2202 being synchronized. Here, it is assumed that local clock 2101 is a (first) local clock of a first communication station (e.g., a base station) and local clock 2202 is a (second) local clock of a second communication station (e.g., a remote or mobile station), and the timing of local clock 2202 may be controlled or disciplined by the second communication station based on the timing of a signal received at the second communication station from the first communication station.

In this example, the two local clocks 2101 and 2202 in question are placed five light-minutes apart. This would for example be the case if one clock would be placed on Earth and the other clock in a Mars orbit. This example can easily be scaled to the MRI environment by replacing "minutes" with "nanoseconds" since light travels about 30 cm per nanosecond and the length of the wireless channel in the MRI environment will be on the order of 30 cm-3 m.

FIG. 2A shows an example where the local clock 2201 at the first communication station and a recovered clock 2102 recovered from a signal received by the first communication station from the second communication station differ by 10 minutes, while local clock 2202 at the second communication station and a recovered clock 2102 recovered from a signal received by the second communication station from the first communication station are perfectly aligned. Because we know that the channel propagation delay is 5 minutes, we can conclude that local clocks 2101 and 2202 are not synchronized.

FIG. 2B shows an example where the difference between local clock 2101 and recovered clock 2102 at the first communication station, and the difference between local clock 2202 and recovered clock 2201 at the second communication station, are both five minutes, which is equivalent to the propagation delay. It can easily be shown that the two clocks 2101 and 2202 are synchronized and will remain synchronized if the time difference measured at both locations is identical, provided that the channel propagation delay is constant or changing at a rate that is much lower than the clock update rates.

Figure 3:
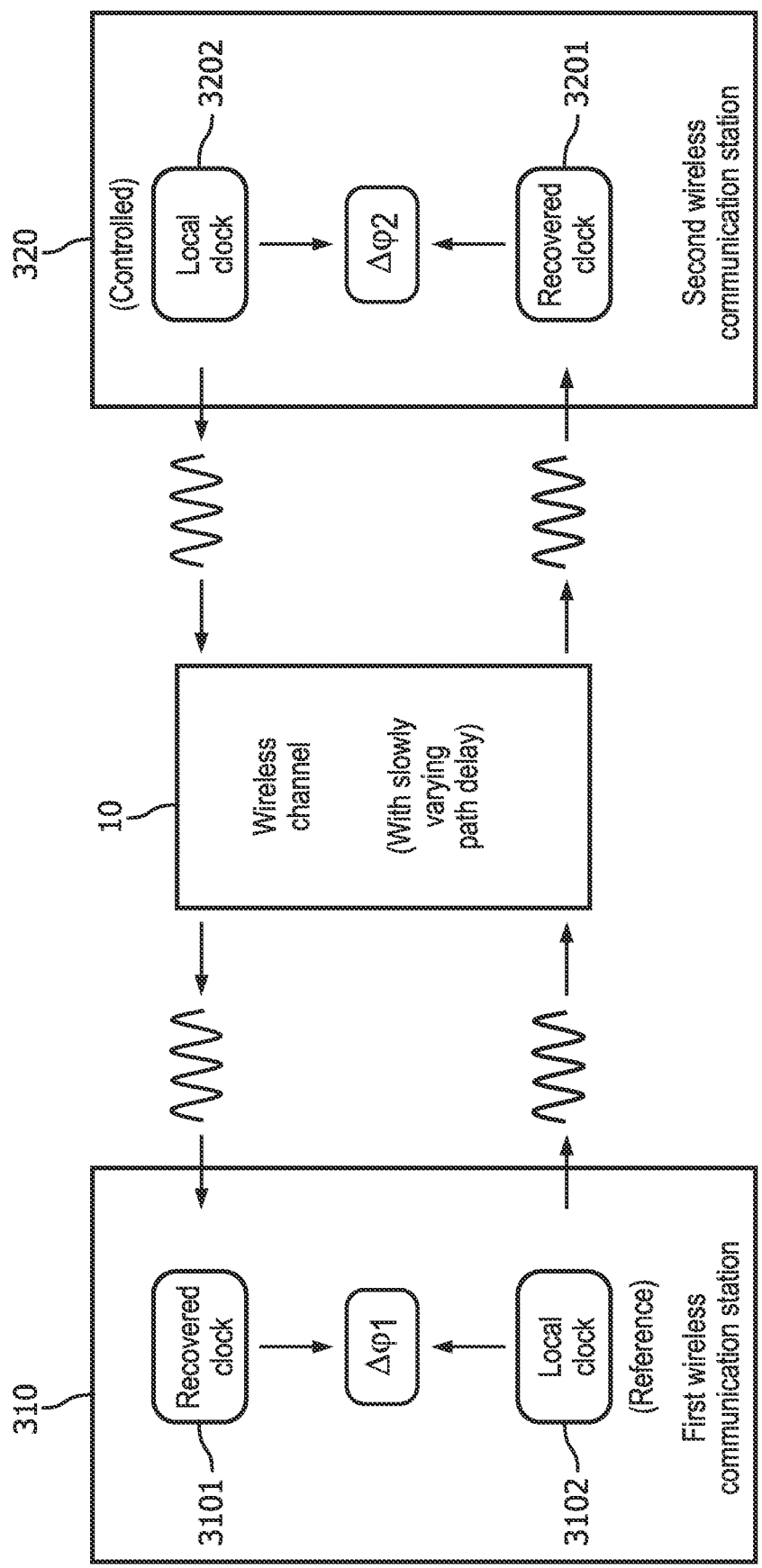
FIG. 3 is a drawing for illustrating conditions for clock synchronization between two wireless communication stations communicating via a wireless channel with a slowly varying path delay.

FIG. 3 is a drawing for illustrating conditions for clock synchronization between first and second wireless communication stations 310 and 320 communicating via a wireless channel 10 with a slowly varying path delay. In particular, as shown in FIG. 3, first wireless communication station 310 (e.g., a main or base station) includes a (first) local clock 2102 and a recovered clock 2101 which is recovered from a signal received by first communication station 310 from second communication station 320, with a phase difference $\Delta\varphi_1$ between first local clock 2102 and a recovered clock 2101. Second wireless communication station 320 (e.g., a remote or mobile station) includes a (second) local clock 2202 and a recovered clock 2201 which is recovered from a signal received by second communication station 320 from first communication station 310, with a phase difference $\Delta\varphi_2$ between second local clock 2202 and a recovered clock 2201. The clocks 2101, 2202, 2102 and 2201 are synchronized when $\Delta\varphi_1=\Delta\varphi_2$.

To address the challenges of synchronizing a local clock of a second wireless communication station (e.g., RF station 106b of MRI system 100) with a local clock of a first wireless communication station (e.g., the main unit of the MRI system including RF coil unit 106a, transmitter 107, radio unit 111, clock generator 108, driver 110, and main controller 124), the first wireless communication station and/or the second wireless communication station may employ carrier phase tracking, embodiments of which are described below. Here, carrier phase tracking refers to a method of measuring and tracking the phase of the recovered carrier for a received wireless signal. The phase measurement may be established by comparing the phase of the recovered carrier to a local reference signal which is synchronous with the local clock, and therefore the local time. The local reference in turn is used to generate a carrier for the respective transmit signal. Beneficially this is done for both the first wireless communication station and the second wireless communication station.

By continuously tracking the carrier phase in both the first and second wireless communication stations, and exchanging messages with phase information, it is possible to adjust the phase of one local reference, beneficially the second wireless communication station, so that the carrier phase measurement in both the first and second wireless communication stations yields the same result. Once the carrier phase measurements in both the first and second wireless communication stations yield the same result within a desired accuracy target or threshold, then the clocks are considered to be synchronized.

Figure 4:
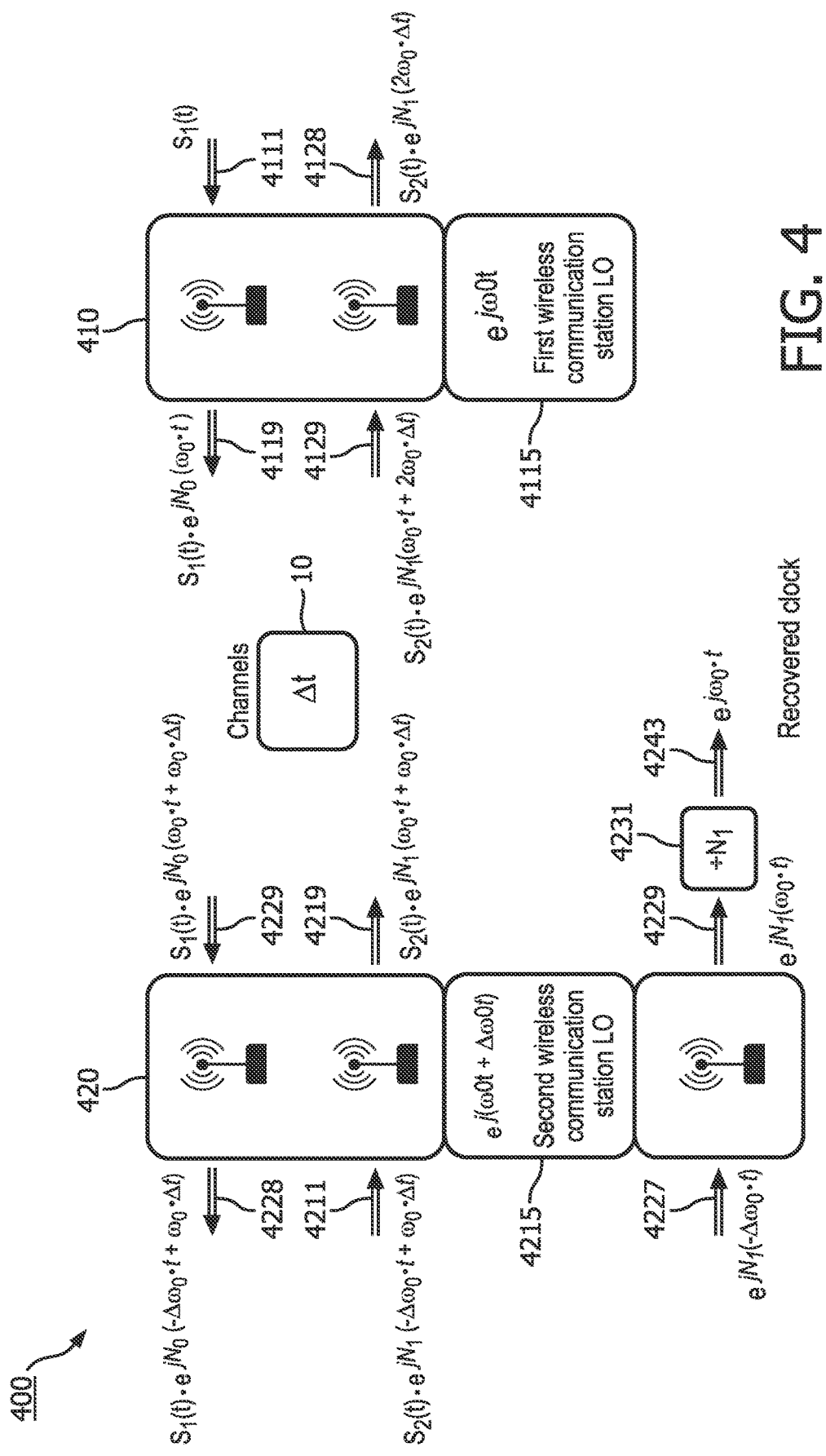
FIG. 4 shows a conceptual diagram illustrating a process for carrier phase synchronization in a wireless communication system.
Figure 5:
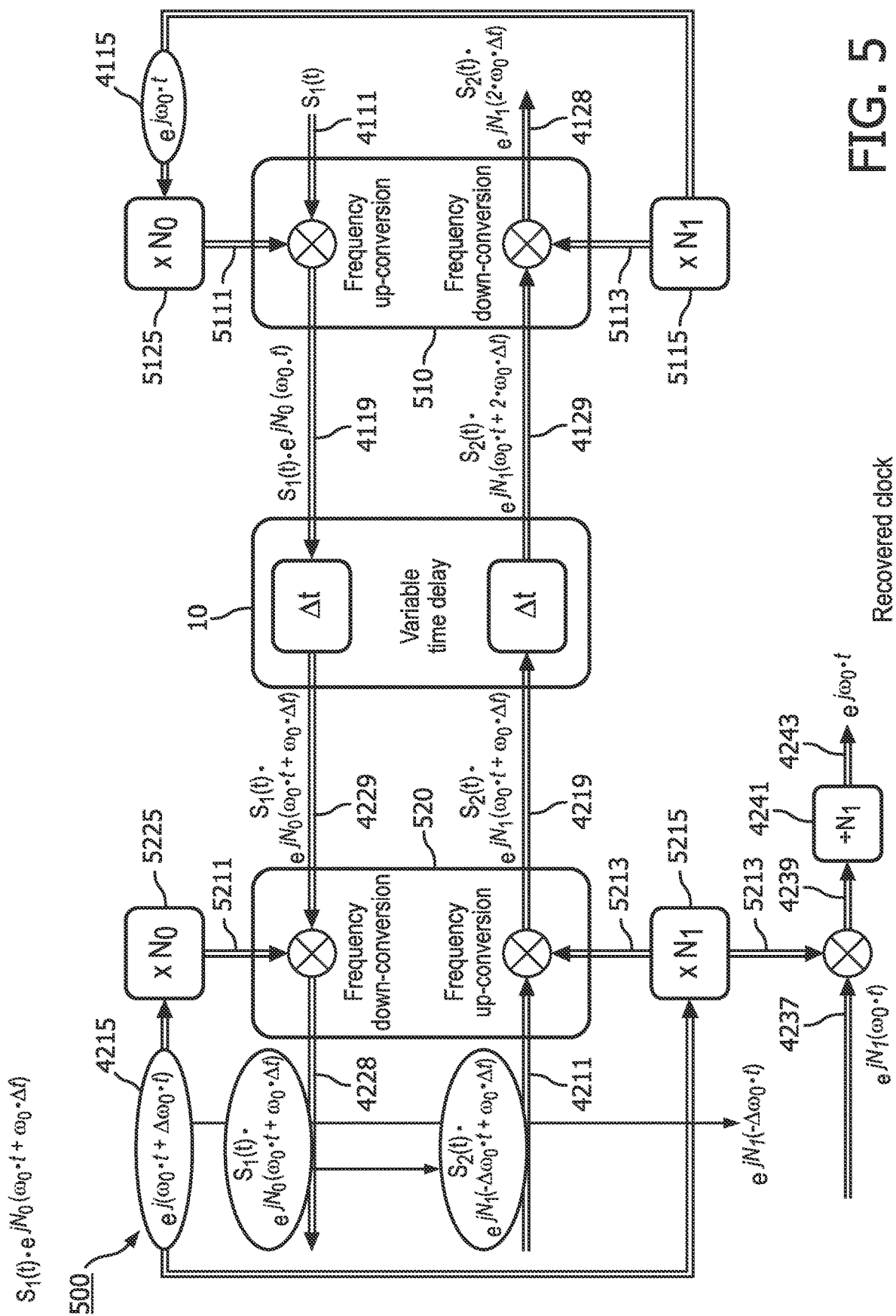
FIG. 5 shows a functional block diagram illustrating an arrangement for carrier phase synchronization in a wireless communication system.

FIG. 4 shows a conceptual diagram illustrating a process for carrier phase synchronization in a wireless communication system 400 which includes first and second wireless communication stations 410 and 420 which communicate via a wireless channel 10. FIG. 5 shows a more detailed functional block diagram illustrating an arrangement for carrier phase synchronization in a wireless communication system 500 which includes first and second wireless communication stations 510 and 520. Wireless communication system 500 may be one embodiment of wireless communication system 400.

First wireless communication station 410 includes a first local oscillator 4115 outputting a signal $e^{j\omega_0 \cdot t}$ and second wireless communication station 420 includes a second local oscillator 4215 outputting a signal $e^{j(\omega_0 \cdot t + \Delta\omega_0 \cdot t)}$. That is, in general there is a frequency difference $\Delta\omega_0$ between the first LO frequency ($\omega_0$) of first LO 4115 and the second LO frequency ($\omega_0 + \Delta\omega_0$) of second LO 4215.

In operation, first wireless communication station 410 processes a first baseband signal 4111 ($S_1(t)$), including data to be communicated to second wireless communication station 420, to produce a first transmit signal 4119 ($S_1(t) \cdot e^{jN0(\omega_0 \cdot t)}$) which first wireless communication station 410 transmits across wireless channel 10. Beneficially, part of the first baseband signal 4111 may be a synchronization sequence (e.g. Barker code) whose pattern is known a priori by second wireless communication station 420. Another part of the first baseband signal 4111 contains information about the carrier phase difference measured at first wireless communication station 410.

In wireless communication system 500, first wireless communication station 510 upconverts first baseband signal 4111 with a first carrier signal 5111 which has a first carrier frequency which is a product of a first value (e.g., $N_0$) 5125 and the first LO frequency $\omega_0$ of first LO 4115, to produce first transmit signal 4119. Beneficially, first carrier signal 5111 having the first carrier frequency ($N_0 \cdot \omega_0$) is synchronous with first LO 4115.

First transmit signal 4119 is delayed by the propagation delay $\Delta t$ through wireless channel 10, and received by second wireless communication station 420 as a delayed first transmit signal 4229 ($S_1(t) \cdot e^{jN0(\omega_0 \cdot t + \omega_0 \cdot \Delta t)}$). In response to the received delayed first transmit signal 4229, second wireless communication station 420 produces a recovered baseband signal 4228 ($S_1(t) \cdot e^{jN0((-\Delta\omega_0 \cdot t + \omega_0 \cdot \Delta t)}$).

In wireless communication system 500, second wireless communication station 520 downconverts received delayed first transmit signal 4229 with a downconversion signal 5211 having a frequency which is the product of the first value (e.g., $N_0$) 5225 and the second LO frequency ($\omega_0 + \Delta\omega_0$) of second LO 4215, to produce recovered baseband signal 4228.

Here it can be seen that recovered baseband signal 4228 includes information identifying the frequency difference $\Delta\omega_0$ between the first LO frequency of first LO 4115 and the second LO frequency of second LO 4215, and the time delay $\Delta t$ through wireless channel 10. This information can be used to provide correction of the frequency difference $\Delta\omega_0$ and the time delay $\Delta t$ to synchronize second LO 4215 and first LO 4115, as explained below.

Second wireless communication station 420 multiplies a second baseband signal $S_2(t)$ with a correction signal ($e^{jN1(-\Delta\omega_0 \cdot t + \omega_0 \cdot \Delta t)}$) to produce a corrected second baseband signal 4211 ($S_2(t) \cdot e^{jN1(-\Delta\omega_0 \cdot t + \omega_0 \cdot \Delta t)}$). Here it is seen that the frequency and phase of the correction signal are scaled multiples of the frequency difference $\Delta\omega_0$ between the first LO frequency of first LO 4115 and the second LO frequency of second LO 4215, and the time delay $\Delta t$ through wireless channel 10, respectively, which are present in recovered baseband signal 4228. Beneficially, part of second baseband signal $S_2(t)$ may be a synchronization sequence (e.g. Barker code) whose pattern is known a priori by first wireless communication station 410. In some embodiments, second baseband signal $S_2(t)$ may be a recovered and cleaned up version of the first baseband signal $S_1(t)$. Having identical message content in $S_1(t)$ and $S_2(t)$ allows for bit error estimation at first wireless communication station 410. This is done by comparing the message content $S_2(t)$ of the received signal with the message content $S_1(t)$ of the signal transmitted by first wireless communication station 410.

In response to corrected second baseband signal 4211, second wireless communication station 420 produces a second transmit signal 4219 ($S_2(t) \cdot e^{jN1(\omega_0 \cdot t + \omega_0 \cdot \Delta t)}$) which second wireless communication station 420 transmits across wireless channel 10.

In wireless communication system 500, second wireless communication station 520 upconverts corrected second baseband signal 4211 with a second carrier signal 5213 having a frequency which is a product of a second value (e.g., $N_1$) 5215 and the second LO frequency ($\omega_0 + \Delta\omega_0$) of second LO 4115 to produce second transmit signal 4219. Beneficially, second carrier signal 5213 having the second carrier frequency ($N_1 \cdot (\omega_0 + \Delta\omega_0)$) is synchronous with second LO 4215.

As a result of this process, second transmit signal 4219 has a second transmit carrier frequency ($N_1 \cdot \omega_0$) which is a product of the second value ($N_1$) and the first LO frequency $W_0$ and which is synchronous in frequency with first LO 4115. However, the second transmit signal 4219 also has a phase offset ($N_1 \cdot \Delta\omega_0 \cdot \Delta t$) due to channel 10. Since this phase offset will vary over time it still needs to be assessed and compensated for. An example of a method for this phase offset correction will be described next.

Second transmit signal 4219 is delayed by the propagation delay $\Delta t$ through wireless channel 10, and received by first wireless communication station 410/510 as a delayed second transmit signal 4129 ($S_2(t) \cdot e^{jN1(\omega_0 \cdot t + 2 \cdot \omega_0 \cdot \Delta t)}$). In response to the received delayed second transmit signal 4129, first wireless communication station 410/510 produces a recovered baseband signal 4128 ($S_1(t) \cdot e^{jN1(2 \cdot \omega_0 \cdot \Delta t)}$).

In wireless communication system 500, first wireless communication station 510 downconverts received delayed second transmit signal 4129 with a downconversion signal 5113 having a frequency which is a product of the second value (e.g., $N_1$) 5115 and the first LO frequency $\omega_0$ of first LO 4115 to produce recovered baseband signal 4128.

Here it can be seen that recovered baseband signal 4128 includes information identifying the time delay $\Delta t$ rough wireless channel 10. This information can be used to provide correction of the carrier phase of first LO 4115 and/or second LO 4215 to synchronize the LOs and clocks of first and second wireless communication stations 410/510 and 420/520 with each other. For example, in some embodiments second wireless communication station 420/520 may adjust the phase of its own local oscillator and clock to account for the propagation delay $\Delta t$ rough wireless channel 10. In some embodiments, second wireless communication station 420/520 may transmit a signal, such as a synch pulse or timing data, to first wireless communication station 410/510 to cause first wireless communication station 410/510 to account for the propagation delay $\Delta t$ through wireless channel 10.

Information regarding the propagation delay $\Delta t$ and/or carrier phase offset $\Delta t \cdot \omega_0$ can be added as message content to the first baseband signal 4111 ($S_1(t)$) and sent from first wireless communication station 410/510 to second wireless communication station 420/520. After receiving the information about the propagation delay $\Delta t$ and/or carrier phase offset $\Delta t \cdot \omega_0$ at second wireless communication station 420/520, second wireless communication station 420/520 may form a third baseband signal 4237 ($e^{jN1(-\omega 0 \cdot \Delta t)}$). Second wireless communication station 420/520 may then upconvert third baseband signal 4237 with second carrier signal 5213 having a frequency which is a product of a second value (e.g., $N_1$) 5215 and the second LO frequency ($\omega_0 + \Delta\omega_0$) of second LO 4115 to produce a carrier-only third transmit signal 4239 ($e^{jN1(\omega 0 \cdot t)}$). Carrier-only third transmit signal 4239 has a frequency that is exactly $N_1$ times the frequency of first LO 4115 of first wireless communication station 510. Using a frequency divider (prescaler) 4241 with ratio $N_1$, a recovered clock signal 4243 ($e^{j\omega 0 \cdot t}$) having the same frequency and phase as first LO 4115 of first wireless communication station 410/510 can be recovered by second wireless communication station 420/520 void of any frequency offset due to the LO of second wireless communication station 420/520 and also void of any variable phase offset due to variable propagation delay $\Delta t$ of wireless channel 10.

Carrier phase tracking as described above allows clock synchronization between remotely located wireless communication stations, but only provides relative time measurement and synchronization. A further improvement to the method is to use a known pseudo-random number (PRN) sequence as a data stream. By applying a similar phase tracking method to the PRN sequence (also referred to here as "code phase tracking"), an absolute time measurement can be established and the absolute clock time can be synchronized between two wireless communication stations.

Figure 6:
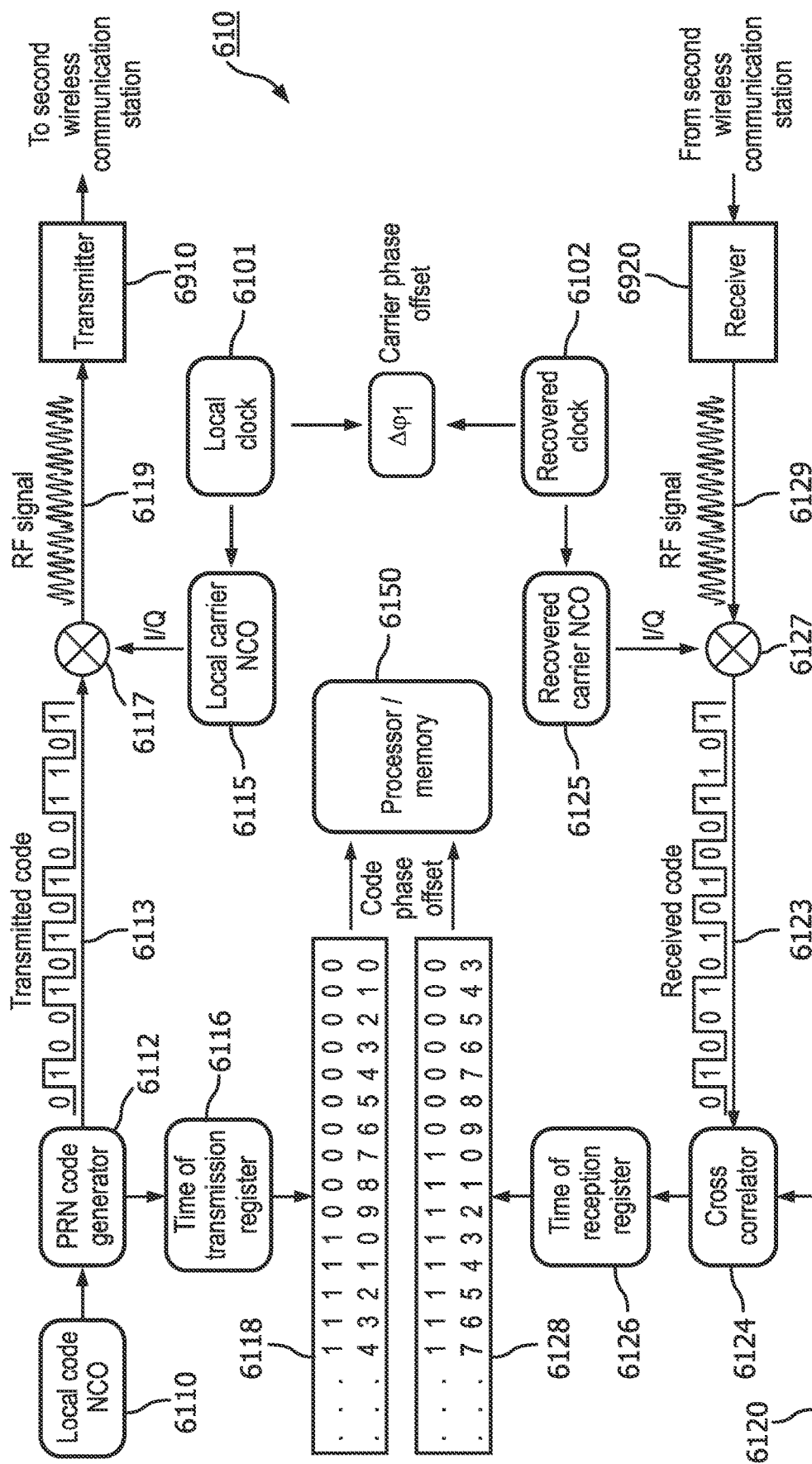
FIG. 6 shows a functional block diagram of a clock management system for a master, or base, station communicating wirelessly with a remote, or mobile, station.
Figure 7:
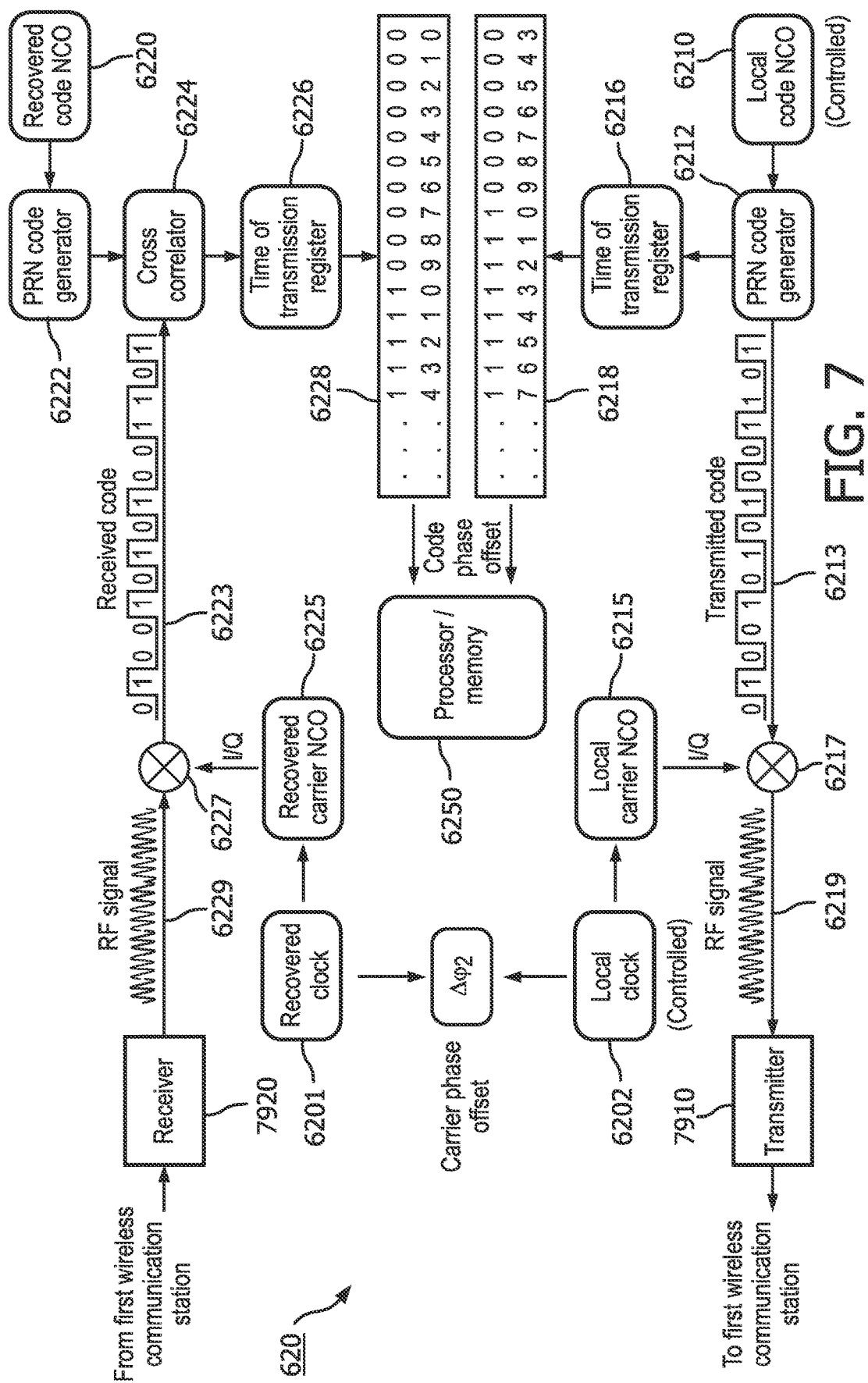
FIG. 7 shows a functional block diagram of a clock management system for a remote, or mobile, station communicating wirelessly with a master, or base, station.

FIG. 6 shows a functional block diagram of a clock management system for a first communication station 610, for example a master, or base, station, and FIG. 7 shows a functional block diagram of a clock management system for a second communication station 620, for example a remote, or mobile, station, which may communicate wirelessly with first communication station 610. First communication station 610 may be one embodiment of first communication station 310, 410 and/or 510 of FIGS. 3, 4 and 5. First communication station 610 may be one embodiment of a wireless communication station of the main unit of MRI system 100 including clock generator 108. Second communication station 620 may be one embodiment of second communication station 320, 420 and/or 520 of FIGS. 3, 4 and 5. Second communication station 620 may be one embodiment of RF station 106b of MRI system 100.

First communication station 610 includes: a (first) local clock 6101, a recovered second clock 6102, a local code numerically controlled oscillator (NCO) 6110, a (first) transmit PRN code generator 6112, a local carrier NCO 6115, a time of transmission register 6116, a transmit or upconversion mixer 6117, a transmit PRN sequence register 6118, a recovered code NCO 6120, a recovered second PRN code generator 6122, a cross correlator 6124, a recovered carrier NCO 6125, a time of reception register 6126, a receive or downconversion mixer 6127, a received PRN sequence register 6128, a processor 6150 with associated memory, a transmitter 6910, and a receiver 6920.

In operation, (first) transmit PRN code generator 6112 generates a first transmit PRN sequence 6113 from a known generator polynomial based on the timing of local code NCO 6110 which is in turn synchronized to local clock 6101. Time of transmission register 6116 stores the time of transmission of first transmit PRN sequence 6113 and first transmit PRN sequence 6113 is stored in transmit PRN code register 6118. Transmit mixer 6117 mixes first transmit PRN sequence 6113 with a local carrier generated by local carrier NCO 6115 in synchronization with local clock 6101, and outputs a first transmit signal 6119 to be transmitted by transmitter 6910 to second wireless communication station 620 via a wireless channel. Meanwhile, receiver 6920 receives a phase shifted second transmit signal 6129 comprising a second transmit signal received via the wireless channel from second wireless communication station 620, with its phase shifted by a second channel phase shift which depends upon the time delay of the wireless channel. Receive mixer 6127 mixes the received phase shifted second transmit signal 6129 with a downconversion signal generated by recovered carrier NCO 6125 in synchronization with recovered second clock 6102, and outputs a received PRN sequence 6123 which was produced at second wireless communication station 620 from the same known generator polynomial which was employed by first wireless communication station 610 to generate first transmit PRN sequence 6113. Cross correlator 6124 correlates received PRN sequence 6123 with a PRN sequence generated by a second PRN code generator 6122 based on the timing of recovered code NCO 6120 which is in turn synchronized to recovered second clock 6102. Time of reception register 6126 stores the time of reception of received PRN sequence 6123 and received PRN sequence 6123 is stored in sequence register 6128.

Processor 6150 may compare the timing of transmit PRN sequence 6113 with the timing of received PRN sequence 6123 to determine a code phase shift error between first wireless communication station 610 and second wireless communication station 620.

Second communication station 620 includes: a (second) local clock 6202, a recovered second clock 6201, a local code numerically controlled oscillator (NCO) 6210, a (first) transmit PRN code generator 6212, a local carrier NCO 6215, a time of transmission register 6216, a transmit or upconversion mixer 6217, a transmit PRN sequence register 6218, a recovered code NCO 6220, a recovered second PRN code generator 6222, a cross correlator 6224, a recovered carrier NCO 6225, a time of reception register 6226, a receive or downconversion mixer 6227, a received PRN sequence register 6228, a processor 6250 with associated memory, a transmitter 7910, and a receiver 7920.

In operation, (second) transmit PRN code generator 6212 generates a second transmit PRN sequence 6213 based on the timing of local code NCO 6210 which is in turn synchronized to local clock 6202. Time of transmission register 6216 stores the time of transmission of first transmit PRN sequence 6213 and first transmit PRN sequence 6213 is stored in transmit PRN code register 6218. Transmit mixer 6217 mixes second transmit PRN sequence 6213 with a local carrier generated by local carrier NCO 6215 in synchronization with local clock 6201, and outputs a second transmit signal 6219 to be transmitted by a transmitter 7910 to first wireless communication station 610 via the wireless channel. Meanwhile, receiver 7920 receives a phase shifted second transmit signal 6229 a phase shifted second transmit signal comprising the first transmit signal 6119 received via the wireless channel from first wireless communication station 610, with its phase shifted by a first channel phase shift which depends upon the time delay of the wireless channel. Receive mixer 6227 mixes the received phase shifted first transmit signal 6129 with a downconversion signal generated by recovered carrier NCO 6225 in synchronization with recovered first clock 6201, and outputs a received PRN sequence 6223. Cross correlator 6224 correlates received PRN sequence 6223 with a PRN sequence generated by second PRN code generator 6222 based on the timing of recovered code NCO 6220 which is in turn synchronized to recovered first clock 6201. Time of reception register 6226 stores the time of reception of received PRN sequence 6223 and received PRN sequence 6223 is stored in sequence register 6228.

Processor 6250 may compare the timing of transmit PRN sequence 6213 with the timing of received PRN sequence 6223 to determine a code phase shift error between first wireless communication station 610 and second wireless communication station 620.

In some embodiments, both first and second wireless communications stations 610 and 620 track the difference in carrier phase and code phase between both first and second wireless communications stations 610 and 620. In some embodiments, messages may be exchanged between first and second wireless communications stations 610 and 620 to correct for any deviation in carrier phase and/or code phase. In some embodiments, one wireless communications station, for example first wireless communication station 610 (which may be an embodiment of the wireless communication station of the main unit of MRI system 100 including clock generator 108), will serve as the clock reference and the other station, for example second wireless communication station 620 (which may be one embodiment of RF station 106b of MRI system 100), will adjust its local clock and code phase according to the messages exchanged.

As explained above, both first and second wireless communications stations 610 and 620 may generate the same PRN sequence from a known generator polynomial. Comparing the locally generated string of PRN symbols with the received string by means of a cross correlation block allows accurate phase alignment between the received PRN sequence and locally generated PRN sequence. Once the code phase is found, the received PRN code can be tracked with an arrangement such as that shown in FIG. 8.

Figure 8:
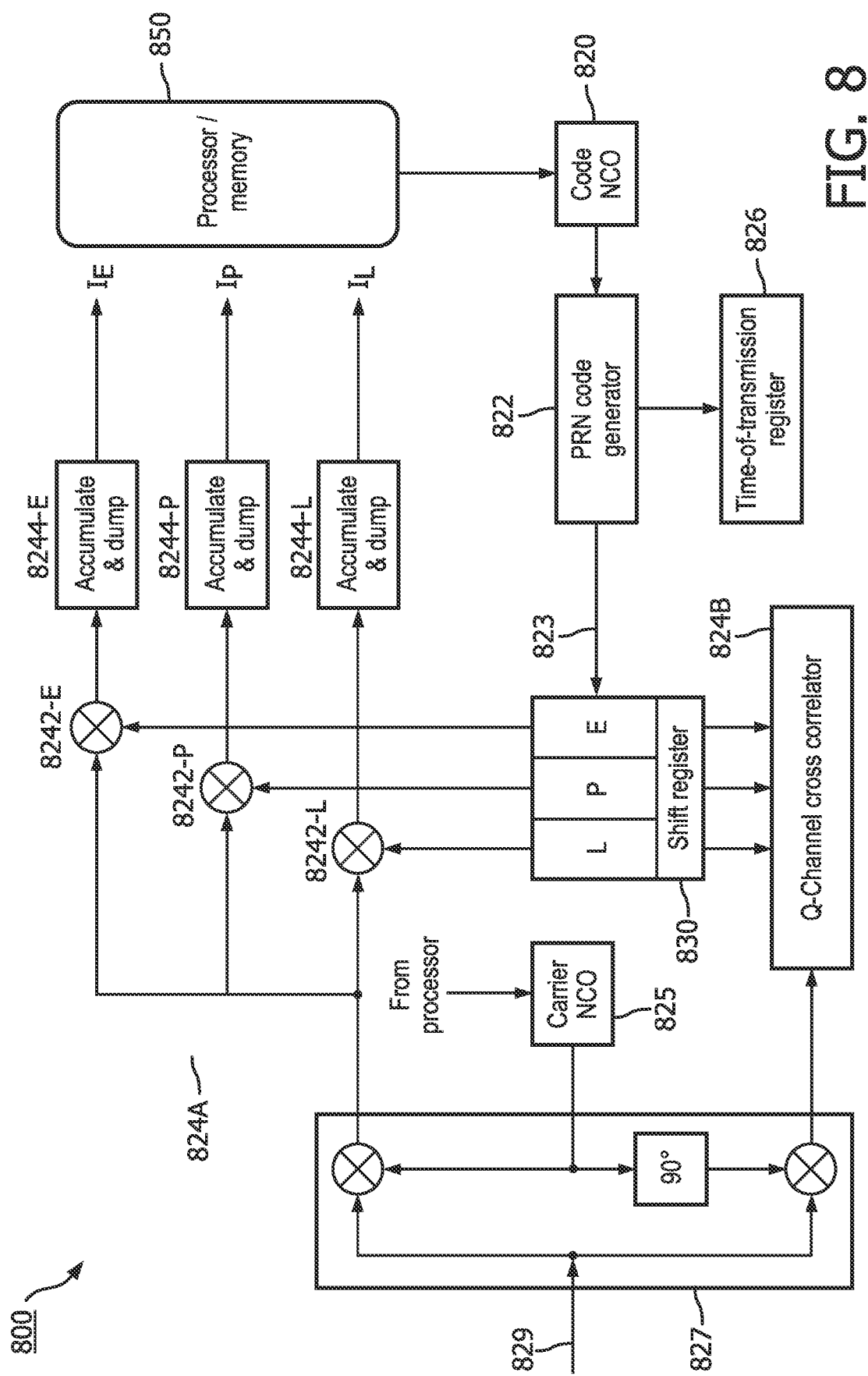
FIG. 8 show a functional block diagram of an arrangement for phase alignment between a received pseudo-random noise (PRN) code and a locally generated PRN code.

FIG. 8 show a functional block diagram of an arrangement 800 for phase alignment between a received pseudorandom noise (PRN) code and a locally generated PRN code. In some embodiments, arrangement 800 may be included in first wireless communication station 610 and/or second wireless communication station 620. The arrangement 800 includes a code NCO 820, an PRN code generator 822, an I-Channel cross correlator 824A, a Q-Channel cross correlator 824B, a recovered carrier NCO 825, a time of transmission register 826, a downconverter 827, a shift register 830, and a processor 850 with associated memory.

I-Channel cross correlator 824A includes multipliers 8242-L, 8242-P, and 8242-E and accumulate-and-dump elements 8244-L, 8244-P, and 8244-E. Q-Channel cross correlator 824B may have the same configuration as I-Channel cross correlator 824A.

In some embodiments processor 850 with associated memory may comprise processor 6150 and associated memory or processor 6250 and associated memory.

In operation, downconverter 827 receives via a wireless channel a receive signal 829 which includes a PRN sequence generated at another wireless communication terminal. Downconverter receives a downconversion signal from recovered carrier NCO 825 and uses it to downconvert receive signal 829 into in-phase ("I") and quadrature ("Q") channel baseband signals which it supplies to corresponding I-Channel cross correlator 824A and Q-Channel cross correlator 824B. Meanwhile, recovered PRN code generator 822 generates a local PRN sequence 823 which it supplies to shift register 830, and stores the time of generation of local PRN sequence 823 to time of transmission register 826. Shift register produces three time shifted copies of the PRN sequence 823—one early, one prompt, and one late—and supplies these copies to multipliers 8242-L, 8242-P, and 8242-E respectively. Multipliers 8242-L, 8242-P, and 8242-E multiply the in-phase channel baseband signal from downconverter 827 with the three time shifted copies of the PRN sequence 823 to produce three in-phase correlation values or results, $I_E$, $I_P$ and $I_L$ which are supplied to processor 850. Similarly, Q-Channel cross correlator 824B correlates the quadrature-phase channel baseband signal from downconverter 827 with the three time shifted copies of the PRN sequence 823 to produce three quadrature-phase correlation values or results which are also supplied to processor 850.

Thus in arrangement 800, the incoming PRN code in received signal 829 is continuously compared (i.e., correlated) to three locally generated copies of the same PRN sequence 823—one early, one prompt and one late. When properly adjusted, the correlation for the prompt copy of PRN sequence 823 should have significantly higher correlation value than the correlations for the early and late copies. The correlation results for the early and late sequences should furthermore have about the same absolute value. The output signals from the early, prompt, and late correlator can be used to generate a discriminator signal that is applied as feedback to the locally recovered PRN sequence (e.g., PRN Code Generator 6122 in FIG. 6). This feedback will ensure that the recovered PRN sequence is in phase with the received PRN sequence.

As described above, in some embodiments first and second wireless communication stations 610 and 620 continuously generate two copies of the PRN sequence. One copy represents the PRN sequence recovered from the received signal stream, the other copy represent the PRN sequence that is transmitted to the respective other station. Similar to carrier phase tracking, the code phase tracking requires that clocks are synchronized if received and transmitted PRN codes on both ends have identical phase.

If there is a difference in code phase between first and second wireless communication stations 610 and 620, then one end, will adjust the phase of its transmitted PRN sequence so that the code phases are the same for both first and second wireless communication stations 610 and 620. Once first and second wireless communication stations 610 and 620 are locked and properly track both carrier phase and code phase, then the transmitted PRN sequence on both stations can be used as a representation of time. As an example, if it is assumed that the PRN sequence has a total length of 1 ms and each individual symbol has duration of 1 ns, then this arrangement would allow to time measurements with 1 ns resolution and a clock periodicity of 1 ms. Higher time resolution can be achieved by measuring time as fractions of a symbol's duration. Longer periodicity can be achieved by using longer PRN sequences.

Within an MRI system such as MRI system 100, sampling clocks are used to generate and sample the various analog signals that are needed to produce an MRI image. These sampling clocks have to be synchronized with each other to very high accuracy. In the case of the RF sampling clocks, the maximum drift of these clocks should be less than 22 ps in order to maintain a phase error in the raw image data below 1 degree. Meanwhile, 22 ps is the time it takes for a wireless signal to travel about 7 mm.

In the case of wireless digital receivers for MRI coils, for example wireless RF station 106b, the sampling clocks inside such receivers should be synchronized to the rest of the MRI system (e.g., clock generator 108) by means of a wireless synchronization signal. There are several challenges associated with the wireless transmission of a synchronization signal in the environment of an MRI system. One of these challenges is multipath propagation.

Figure 9:
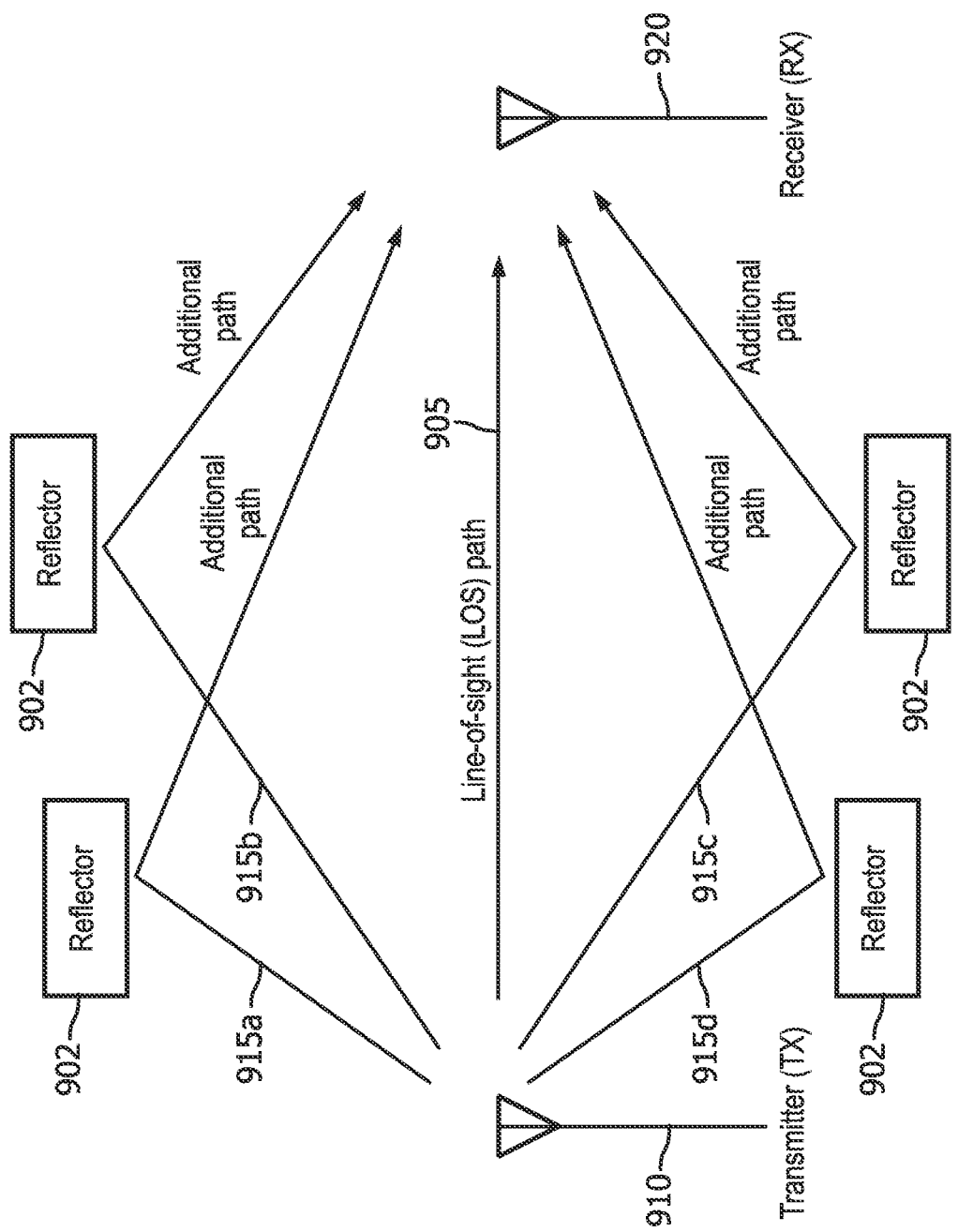
FIG. 9 illustrates the phenomenon of multi-path propagation which may occur in a wireless communication system for an MRI system.

FIG. 9 illustrates the phenomenon of multi-path propagation which may occur in a wireless communication system for an MRI system. FIG. 9 illustrates a wireless transmitter 910 (e.g., of a wireless communication station of the main unit of MRI system 100) and a wireless receiver 920 (e.g., of wireless RF station 106b). Here, wireless transmitter 910 transmits a wireless signal to wireless receiver 920 over a wireless channel in the presence a plurality of reflectors 902. The wireless signal travels from wireless transmitter 910 to wireless receiver 920 via a variety of paths, including a main line-of-sight (LOS) path 905 and a plurality of additional paths 915a, 915b, 915c and 915d. Furthermore, one or more of the additional paths 915a, 915b, 915c and 915d may change over time, for example due to movement of one or more of the reflectors 902 and/or wireless transmitter 910 and/or wireless receiver 920. This effect causes 'Multipath Fading': the signals on the additional paths 915a, 915b, 915c and 915d arrive with different delays, amplitudes and phases at wireless receiver 920, therefore partially cancelling or augmenting signal received over LOS path 905. In the case of wireless signals with very short symbol duration, the multipath signals may even carry information from previous symbols that may be completely unrelated to the current symbol.

Figure 10:
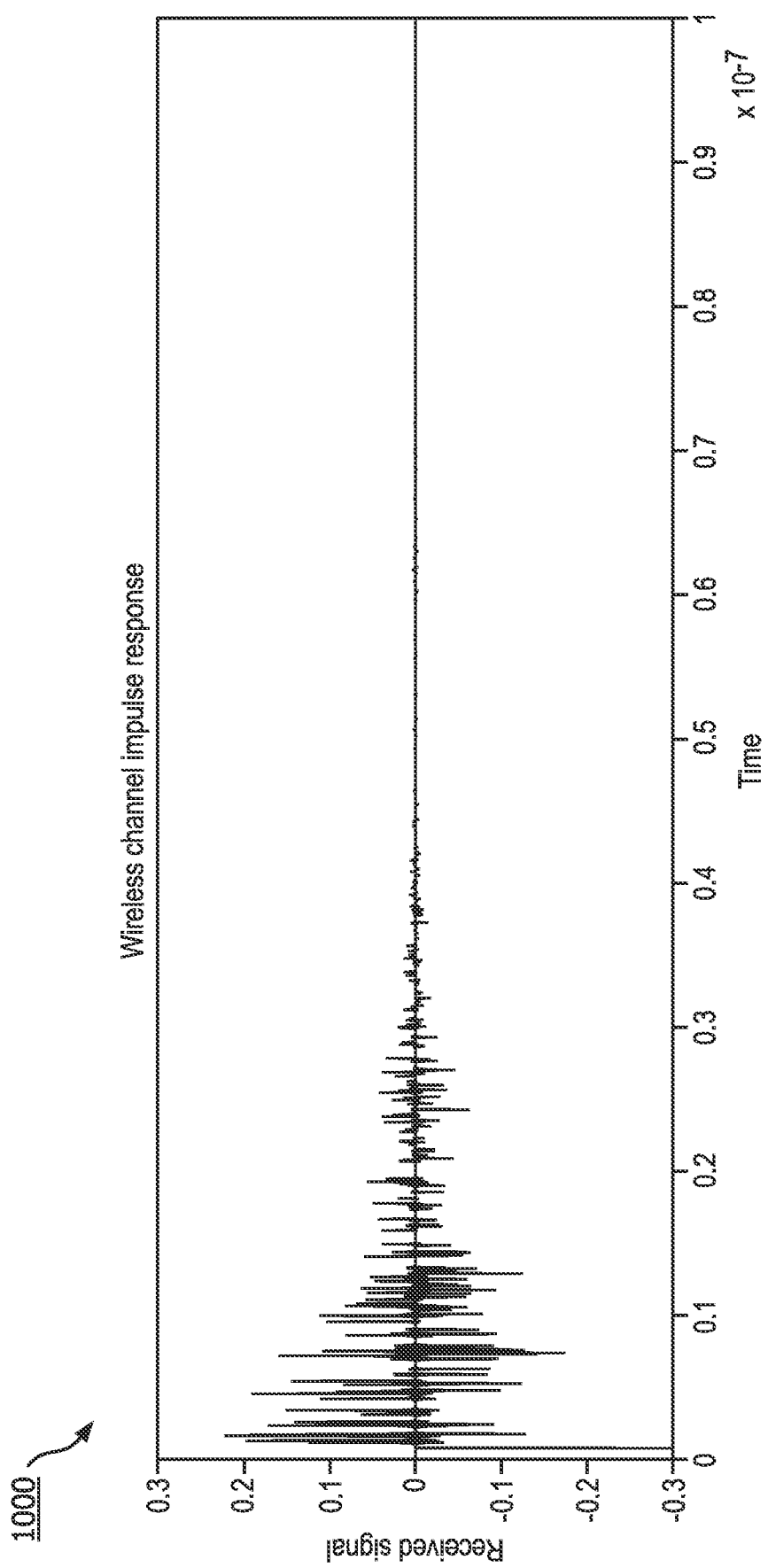
FIG. 10 illustrates an example of an impulse response for a wireless communication channel which features multipath propagation.

FIG. 10 illustrates an example of an impulse response 1000 for a wireless communication channel which features multipath propagation. In particular, FIG. 10 illustrates a typical impulse response function for an ultra-wideband (UWB) transmission channel with a channel bandwidth in excess of 500 MHz. The various delayed echoes of the original pulse are clearly distinguishable in time due to the very large channel bandwidth. The delay spread of the impulse response function depends on the nature of the surrounding of the wireless channel. The typical delay spread inside an MRI scanner is on the order of 10 ns, which is equivalent to ~10 ft of travel distance added to the delayed signals. Accordingly, it would be beneficial to provide one or more multipath propagation mitigation techniques which can address the characteristics of this environment.

Figure 11:
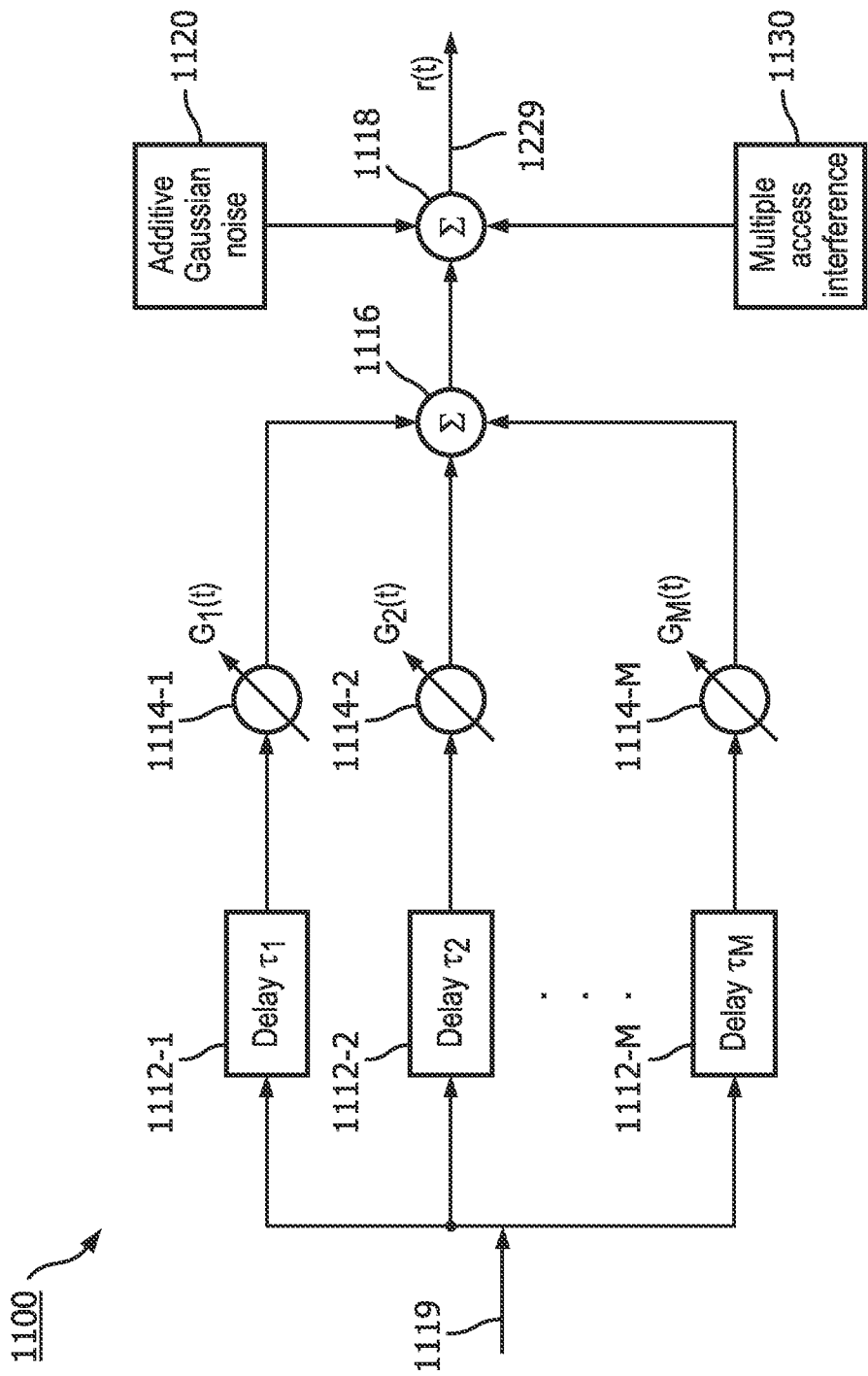
FIG. 11 illustrates a model of a wireless communication channel which features multipath propagation.

FIG. 11 illustrates a model 1100 of a wireless communication channel which features multipath propagation. Here, a transmitted signal 1119 propagates along a plurality of paths (LOS path and additional paths), with each path depicted as a delay line 1112-1, 1112-2 . . . 1112-M with specific delay $\tau_1 \ldots \tau_M$ and complex multipliers 1114-1, 1114-2 . . . 1114-M with complex gains $G_1(t) \ldots G_M(t)$. All of these paths are combined together with further impairments of Additive Gaussian Noise (AGN) 1120 and Multiple Access Interference 1130 by combiner 1116 to a produce a single receive signal r(t) 1229.

As noted above, all of the clocks within an MRI system which are involved in mixed signal processing should be synchronized with high accuracy. Failure to do so will introduce errors into the signal chain, which will manifest as noise on top of the signal, or as artifacts due to encoding errors. If part of the signal chain is done wirelessly, then the clock needs to be recovered from the wireless signal.

However, wireless signals suffer impairments due to multiple path fading, varying channel delay, unwanted blocking signals and other factors. Each of these impairments has a negative impact on the quality of the recovered clock signal. A variety of measures may be employed to combat these impairments, including the use of an ultra-wideband (UWB) wireless signal (e.g., a transmission bandwidth >500 MHz), the use of special signal encoding based on Pseudo-Random-Noise (PRN) Codes such as Barker or Gold Codes, the use of a short impulse radar (IR) type signal, the use of a matched filter and/or a Rake receiver on the receiving end, and/or periodic characterization of the channel by measurement of the time and/or frequency response of the channel.

One way to combating deteriorating effects of a multipath channel is by carefully probing the channel and then applying a correction to the receive signal. For example, one can record the impulse response of the channel at a rate much higher than the temporal variations of the channel and use this information for a 'Rake Receiver' on the receiving end. The channel impulse response can be found in either the time domain, by applying a short Impulse Radar (IR) style pulse, or in the frequency domain, by sweeping over the channel bandwidth using a chirp style signal.

Figure 12:
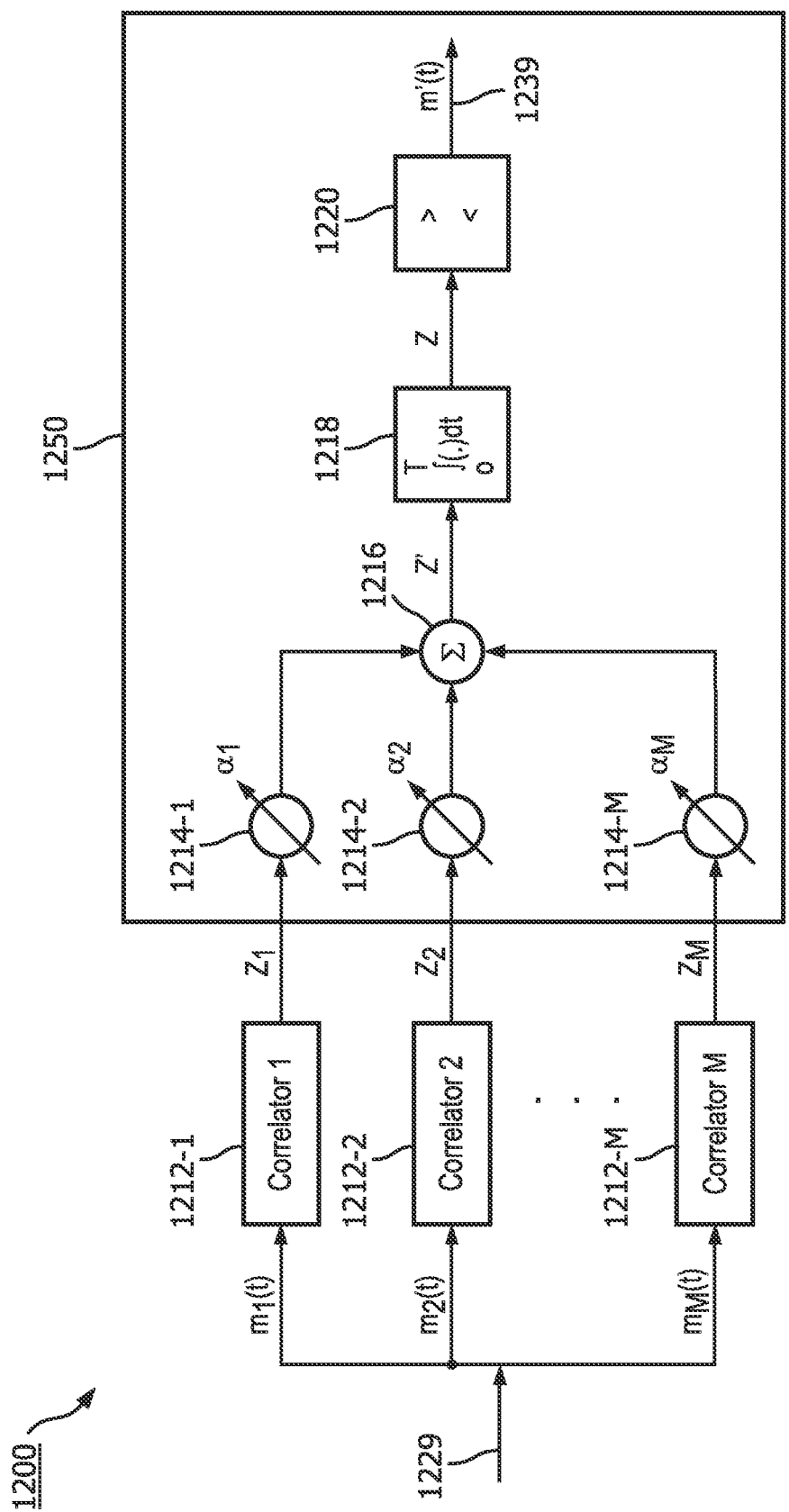
FIG. 12 illustrates an example embodiment of a receiver architecture which may be employed for receiving a wireless signal in a communication channel which features multipath propagation.

FIG. 12 illustrates an example embodiment of a portion of a receiver 1200 which may be employed for receiving a wireless signal 1229 in a communication channel which features multipath propagation. Receiver 1200 includes a plurality of correlators 1212-1, 1212-2 . . . 1212-M and a signal processor 1250 which includes variable gain elements 1214-1, 1214-2 . . . 1214-M, a combiner 1216, an integrator 1218 and a decision block 1220.

In operation, received wireless signal 1229 is provided to correlators 1212-1, 1212-2 . . . 1212-M, which each correlate received wireless signal 1229 with a corresponding time delay which is selected to correspond to one path of the multipath channel. Signal processor 1250 processes correlation outputs of the plurality of correlators by: weighting outputs of each correlator by a corresponding factor $\alpha 1$, $\alpha 1, \ldots \alpha M$, which corresponds to a relative strength of the corresponding path of the multipath channel; adding the weighted outputs of the correlators to produce a sum; integrating the sum over one bit period of the received phase shifted second transmit signal; and comparing the sum to a threshold to determine a value for a bit of the received wireless signal 1229 in the bit period, and outputting a multipath compensated output signal 1239.

Figure 13:
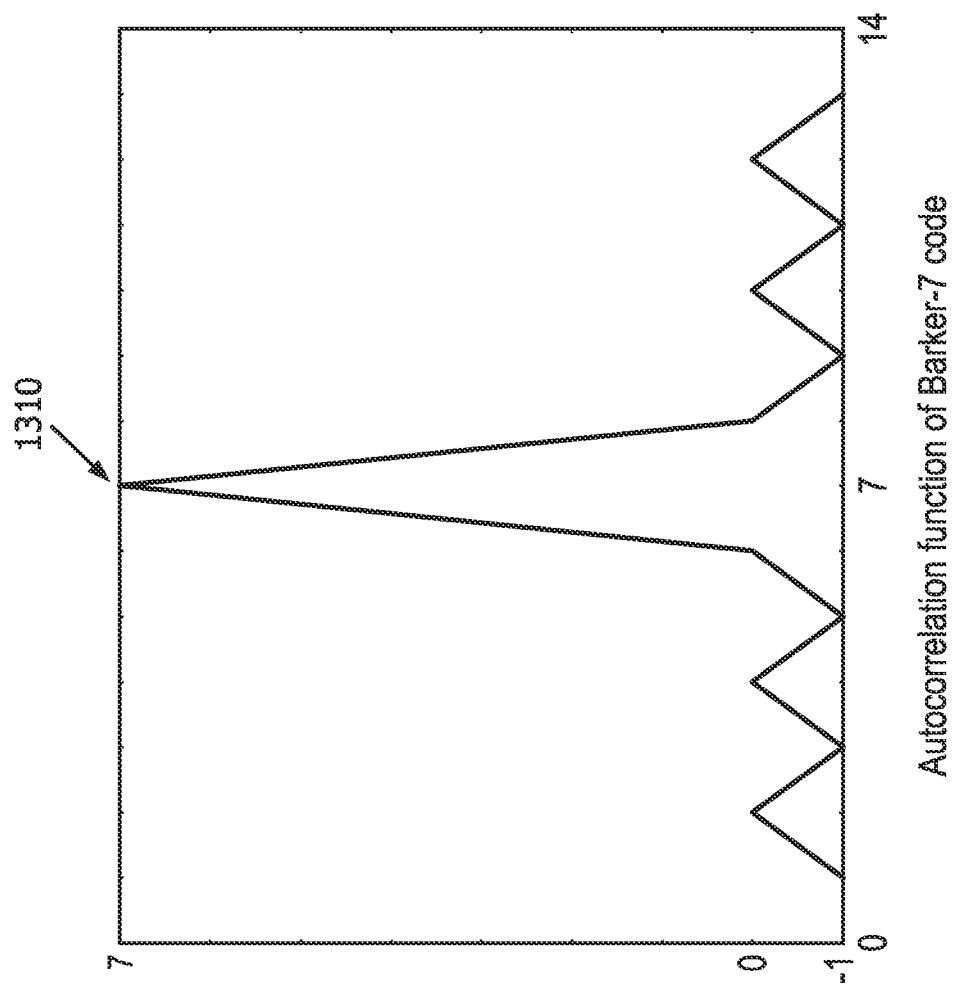
FIG. 13 illustrates the autocorrelation of an example of a synchronization sequence which may be transmitted by a wireless communication station.

Multipath echoes also may be reduced in the received signal by using an UWB signal with a long encoding length as a synch pulse. The encoding signal may be chosen so that it has a strong autocorrelation peak with low side lobes. FIG. 13 illustrates the autocorrelation of an example of a synchronization sequence which may be transmitted by a wireless communication station to combat multipath propagation effects, exhibiting a strong autocorrelation peak 1310. Examples for such signals are Pseudo-Random-Noise (PRN) Codes, such as Barker Codes, or Gold Codes.

While preferred embodiments are disclosed herein, many variations are possible which remain within the concept and scope of the invention. Such variations would become clear to one of ordinary skill in the art after inspection of the specification, drawings and claims herein. The present invention therefore is not to be restricted except within the scope of the appended claims.

What is claimed is:

1. A method, comprising:
   transmitting from a radio frequency (RF) transmitter of a first wireless communication station of an magnetic resonance imaging (MRI) system a first transmit signal comprising a first baseband signal upconverted with a first carrier signal, the first carrier signal having a first carrier frequency which is a product of a first value and a first local oscillator (LO) frequency of a first LO of the first wireless communication station, the first carrier signal being synchronous with the first LO of the first wireless communication station;
   receiving via a wireless channel at an RF receiver of a second wireless communication station of the MRI system a phase shifted first transmit signal comprising the first transmit signal with its phase shifted by a first channel phase shift which is equal to a time delay of the wireless channel multiplied by the first carrier frequency;
   at the second wireless communication station, multiplying a second baseband signal with a correction signal to produce a corrected second baseband signal, and transmitting a second transmit signal comprising the corrected second baseband signal upconverted with a second carrier signal, the second carrier signal having a second carrier frequency which is a product of a second value and a second LO frequency of a second LO of the second wireless communication station, wherein the second transmit signal has a second transmit carrier frequency which is a product of the second value and the first LO frequency and which is synchronous in frequency with the first LO of the first wireless communication station;
   receiving via the wireless channel at an RF receiver of the first wireless communication station a phase shifted second transmit signal comprising the second transmit signal with its phase shifted by a second channel phase shift which is equal to the time delay of the wireless channel multiplied by the second transmit carrier frequency; and
   ascertaining at the first wireless communication station the time delay of the wireless channel from the received phase shifted second transmit signal.

2. The method of claim 1, wherein the first wireless communication station includes a first clock and the second wireless communication station includes a second clock, the method further comprising adjusting one of the first and second clocks in response to the ascertained time delay of the wireless channel.

3. The method of claim 1 wherein the second baseband signal and the first baseband signal are the same as each other.

4. The method of claim 1, wherein the correction signal has a frequency equal to a product of: (1) the second value, and (2) a difference between the first LO frequency and the second LO frequency; and wherein the correction signal has a phase equal to a product of (1) the second value, (2) the first LO frequency, and (3) the time delay of the wireless channel.

5. The method of claim 1, wherein recovering the channel phase shift at the first wireless communication station from the received phase shifted second transmit signal comprises mixing the received phase shifted second transmit signal with a downconversion signal having a frequency which is a product of the second value and the first LO frequency and which is synchronous with the first LO.

6. The method of claim 1, further comprising, at the first wireless communication station:
   generating a transmit pseudorandom number (PRN) sequence using a local clock of the first wireless communication station;
   recovering a received PRN sequence from the received phase shifted second transmit signal using a recovered clock of the first wireless communication station which is recovered from the received phase shifted second transmit signal, the received PRN sequence having been generated at the second wireless communication station using a local clock of the second wireless communication station; and
   comparing the transmit PRN sequence to the received PRN sequence to determine a code phase shift error between the first wireless communication station and the second wireless communication station.

7. The method of claim 1, wherein the wireless channel is a multipath channel, the method further comprising, at the first wireless communication station:
   supplying the received phase shifted second transmit signal to a plurality of correlators, each correlator being configured to correlate the received phase shifted second transmit signal with a corresponding time delay which is selected to correspond to one path of the multipath channel;
   weighting outputs of each correlator by a corresponding factor which corresponds to a relative strength of the corresponding path of the multipath channel;
   adding the weighted outputs of the correlators to produce a sum;
   integrating the sum over a bit interval of the received phase shifted second transmit signal; and
   comparing the sum to a threshold to determine a value for a bit of the received phase shifted second transmit signal in the bit interval.

8. The method of claim 1, wherein the first transmit signal includes a synchronization sequence, the method further comprising, at the second wireless communication station:
   detecting the received phase shifted first transmit signal with a matched filter for the synchronization sequence to produce a synchronization output signal; and
   detecting a peak in the synchronization output signal and adjusting a local clock of the second wireless communication station in response to a timing of the detected peak in the synchronization output signal.

9. A system, comprising:
   a first wireless communication station having,
   a first local oscillator (LO) configured to produce a first LO signal having a first LO frequency, a first radio frequency (RF) transmitter, and
a first RF receiver,
wherein the first RF transmitter is configured to transmit a first transmit signal comprising a first baseband signal upconverted with a first carrier signal, the first carrier signal having a first carrier frequency which is a product and the first value and the first LO frequency, the first carrier signal being synchronous with the first LO;
a second wireless communication station having,
a second LO configured to produce a second LO signal having a second LO frequency,
a second RF transmitter, and
a second RF receiver,
wherein the second RF receiver is configured to receive via a wireless channel a phase shifted first transmit signal comprising the first transmit signal with its phase shifted by a first channel phase shift which is equal to a time delay of the wireless channel multiplied by the first carrier frequency,
wherein the second wireless communication station is configured to multiply a second baseband signal with a correction signal to produce a corrected second baseband signal,
wherein the second RF transmitter is configured to transmit a second transmit signal comprising the corrected second baseband signal upconverted with a second carrier signal, the second carrier signal having a second carrier frequency which is a product of a second value and a second frequency of a second LO of the second wireless communication station, wherein the second transmit signal has a second transmit carrier frequency which is a product of the second value and the first LO frequency and which is synchronous in frequency with the first LO of the first wireless communication station,
wherein the first RF receiver is configured to receive via the wireless channel a phase shifted second transmit signal comprising the second transmit signal with its phase shifted by a second channel phase shift which is equal to the time delay of the wireless channel multiplied by the second transmit carrier frequency, and
wherein the first wireless communication station is configured to ascertain the time delay of the wireless channel from the received phase shifted second transmit signal.

10. The system of claim 9, further comprising:
a magnet;
a patient table configured to hold a patient;
gradient coils configured to at least partially surround at least a portion of the patient;
a radio frequency (RF) coil unit configured to apply an RF signal to at least a portion of patient which is being imaged, and to alter the alignment of the magnetic field; and
a receive coil unit configured to sense a magnetic resonance signal emitted from the patient in response to the RF signal,
wherein the second wireless communication station is configured to transmit to the first communication station via the wireless channel data representing the sensed magnetic resonance signal.

11. The system of claim 9, wherein the correction signal has a frequency equal to a product of (1) the second value; and (2) a difference between the first LO frequency and the second LO frequency, and wherein the correction signal has a phase equal to a product of (1) the second value, (2) the first LO frequency, and (3) the time delay of the wireless channel.

12. The system of claim 9, wherein the first wireless communication station further includes a downconverter configured to mix the received phase shifted second transmit signal with a downconversion signal having a frequency which is a product of the second value and the first LO frequency and which is synchronous with the first LO.

13. The system of claim 9, wherein the first wireless communication station includes a first local clock, and wherein the second wireless communication station includes:
a second local clock;
a recovered clock recovered from the received phase shifted first transmit signal;
a transmit pseudorandom number (PRN) sequence generator configured to generate a transmit PRN sequence using the second local clock; and
a processor configured to:
recover a received PRN sequence from the received phase shifted first transmit signal using the recovered clock, the received PRN sequence having been generated at the first wireless communication station using the first local clock; and
compare the transmit PRN sequence to the received PRN sequence to determine a code phase shift error between the first wireless communication station and the second wireless communication station.

14. The system of claim 9, wherein the wireless channel is a multipath channel, wherein the first wireless communication station comprises:
a plurality of correlators, each configured to correlate the received phase shifted second transmit signal with a corresponding time delay which is selected to correspond to one path of the multipath channel;
a processor configured to process correlation outputs of the plurality of correlators by:
weighting outputs of each correlator by a corresponding factor which corresponds to a relative strength of the corresponding path of the multipath channel;
adding the weighted outputs of the correlators to produce a sum;
integrating the sum over one bit period of the received phase shifted second transmit signal; and
comparing the sum to a threshold to determine a value for a bit of the received phase shifted second transmit signal in the bit period.

15. The system of claim 9, wherein first transmit signal includes a synchronization sequence, wherein the second wireless communication station includes:
a local clock;
a matched filter for the synchronization sequence configured to detect the received phase shifted first transmit signal and to produce a synchronization output signal; and
a peak detector configured to detect a peak in the synchronization output signal,
wherein the local clock is adjusted in response to a timing of the detected peak in the synchronization output signal.

16. A system, comprising:
a first wireless communication station, including:
a first local clock;
a first pseudorandom number (PRN) sequence generator configured to generate a first PRN sequence using the first local clock; and a first transmitter configured to transmit a first transmit signal including the first PRN sequence; and a second wireless communication station which is configured to receive via a wireless channel a phase shifted first transmit signal comprising the first transmit signal with its phase shifted by a first channel phase shift which depends upon a time delay of the wireless channel, wherein the second wireless communication station includes:

a second local clock;

a second PRN sequence generator configured to generate a second PRN sequence using the second local clock;

a recovered first clock recovered from the received phase shifted first transmit signal; and a processor configured to:

recover the first PRN sequence from the received phase shifted first transmit signal using the recovered first clock; and compare the second PRN sequence to the recovered first PRN sequence to determine a code phase shift error between the first wireless communication station and the second wireless communication station.

17. The system of claim 16, wherein the second communication station further includes a second transmitter configured to transmit a second transmit signal including the second PRN sequence, and wherein the first wireless communication station is configured to receive via the wireless channel a phase shifted second transmit signal comprising the second transmit signal with its phase shifted by a second channel phase shift which depends upon the time delay of the wireless channel, wherein the first communication station further includes:

a recovered second clock recovered from the received phase shifted second transmit signal; and a processor configured to:

recover the second PRN sequence from the received phase shifted second transmit signal using the recovered second clock; and compare the first PRN sequence to the recovered second PRN sequence to determine a code phase shift error between the first wireless communication station and the second wireless communication station.

18. The system of claim 16, wherein the processor includes a correlator which is configured to compare the recovered first PRN sequence to at least three time shifted copies of the second PRN sequence and to determine which of the at least three time shifted copies of the second PRN sequence has a highest correlation with the recovered first PRN sequence, and wherein the system is configured to adjust a timing of one of the first and second PRN sequence generators in accordance with which of the at least three time shifted copies of the second PRN sequence has a highest correlation with the recovered first PRN sequence to synchronize the first and second PRN sequence generators with each other.

19. The system of claim 16, wherein the wireless channel is a multipath channel, wherein the second wireless communication station comprises:

a plurality of correlators, each configured to correlate the received phase shifted first transmit signal with a corresponding time delay which is selected to correspond to one path of the multipath channel;

a signal processor configured to process correlation outputs of the plurality of correlators by:

weighting outputs of each correlator by a corresponding factor which corresponds to a relative strength of the corresponding path of the multipath channel;

adding the weighted outputs of the correlators to produce a sum;

integrating the sum over one bit period of the received phase shifted second transmit signal; and comparing the sum to a threshold to determine a value for a bit of the received phase shifted second transmit signal in the bit period.

20. The system of claim 16, wherein first transmit signal includes a synchronization sequence, wherein the second wireless communication station includes:

a matched filter for the synchronization sequence configured to detect the received phase shifted first transmit signal and to produce a synchronization output signal; and a peak detector configured to detect a peak in the synchronization output signal, wherein the second local clock is adjusted in response to a timing of the detected peak in the synchronization output signal.

* * * * *